United States Patent
Sim et al.

(10) Patent No.: US 11,851,320 B2
(45) Date of Patent: Dec. 26, 2023

(54) METHOD OF DEPOSITING NANOTWINNED NICKEL-MOLYBDENUM-TUNGSTEN ALLOYS

(71) Applicant: THE JOHNS HOPKINS UNIVERSITY, Baltimore, MD (US)

(72) Inventors: Gi-Dong Sim, Elkridge, MD (US); Jessica Krogstad, Champaign, IL (US); Timothy P. Weihs, Baltimore, MD (US); Kevin J. Hemker, Reisterstown, MD (US); Gianna Valentino, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 894 days.

(21) Appl. No.: 16/609,968

(22) PCT Filed: May 1, 2018

(86) PCT No.: PCT/US2018/030384
§ 371 (c)(1),
(2) Date: Oct. 31, 2019

(87) PCT Pub. No.: WO2018/204320
PCT Pub. Date: Nov. 8, 2018

(65) Prior Publication Data
US 2020/0055725 A1    Feb. 20, 2020

Related U.S. Application Data

(60) Provisional application No. 62/492,558, filed on May 1, 2017.

(51) Int. Cl.
*B81B 3/00*    (2006.01)
*B81C 1/00*    (2006.01)
(Continued)

(52) U.S. Cl.
CPC ........ *B81B 3/0075* (2013.01); *B81C 1/00674* (2013.01); *C23C 14/18* (2013.01);
(Continued)

(58) Field of Classification Search
CPC .................................................... B81B 3/0075
See application file for complete search history.

(56) References Cited

U.S. PATENT DOCUMENTS 8,420,185 B1    4/2013    Chueh et al.
8,557,507 B2    10/2013   Jang et al.
(Continued)

FOREIGN PATENT DOCUMENTS

JP    2014199920 A    10/2014
RU    2235798 C2      9/2004
WO    2015020916 A1   2/2015

OTHER PUBLICATIONS

Zhang et al., (2015) "Strengthening high-stacking-fault-energy metals via parallelogram nanotwins" Scripta Materialia, 108:35-39.
(Continued)

*Primary Examiner* — Moazzam Hossain
(74) *Attorney, Agent, or Firm* — JOHNS HOPKINS TECHNOLOGY VENTURES

(57) ABSTRACT

The present invention is directed to the synthesis of metallic nickel-molybdenum-tungsten films and coatings with direct current sputter deposition, which results in fully-dense crystallographically textured films that are filled with nano-scale faults and twins. The as-deposited films exhibit linear-elastic mechanical behavior and tensile strengths above 2.5 GPa, which is unprecedented for materials that are compatible with wafer-level device fabrication processes. The ultrahigh strength is attributed to a combination of solid solution strengthening and the presence of the dense nano-scale faults and twins. These films also possess excellent thermal
(Continued)

RIE TO RELEASE FILM

Ni-Mo-W and mechanical stability, high density, low CTE, and electrical properties that are attractive for next generation metal MEMS applications. Deposited as coatings these films provide protection against friction and wear. The as-deposited films can also be heat treated to modify the internal microstructure and attendant mechanical properties in a way that provides a desired balance of strength and toughness.

16 Claims, 18 Drawing Sheets

(51) Int. Cl.
C23C 14/18 (2006.01)
C23C 14/58 (2006.01)
C25D 3/56 (2006.01)
C25D 5/50 (2006.01)

(52) U.S. Cl.
CPC .......... *C23C 14/5806* (2013.01); *C25D 3/562* (2013.01); *C25D 5/50* (2013.01); *B81B 2203/0118* (2013.01); *B81C 2201/0132* (2013.01); *B81C 2201/0133* (2013.01); *B81C 2201/0181* (2013.01); *B81C 2201/0197* (2013.01)

(56) References Cited

U.S. PATENT DOCUMENTS

| | | | |
|---|---|---|---|
| 9,156,089 B2 | 10/2015 | Billieres | |
| 2002/0005233 A1 | 1/2002 | Schirra et al. | |
| 2003/0085470 A1* | 5/2003 | Hasunuma | H01L 23/53252 257/774 |
| 2005/0035702 A1* | 2/2005 | Kim | H01J 29/07 445/47 |
| 2008/0124565 A1* | 5/2008 | Carlson | C23C 28/021 205/255 |
| 2011/0008646 A1* | 1/2011 | Cahalen | B32B 15/01 205/176 |
| 2012/0328904 A1* | 12/2012 | Baskin | C25D 5/12 977/773 |
| 2014/0374263 A1 | 12/2014 | Cai et al. | |
| 2015/0004434 A1* | 1/2015 | Goodrich | C25D 5/617 205/176 |
| 2015/0233019 A1 | 8/2015 | Zhang et al. | |
| 2016/0177959 A1* | 6/2016 | Marya | C10M 103/04 415/177 |

OTHER PUBLICATIONS

Kurz et al., (2014) "Anomalously high density and thermal stability of nanotwins in Ni(W) thin films: Quantitative analysis by x-ray diffraction" Journal of Materials Research 29(15):1642-1655.

Casciano et al., (2014) "Corrosion Resistance of Electrodeposited Ni—Mo—W Coatings" Int. J. ElectroChem. Sci, vol. 9, pp. 4413-4428.

Ginter, Nawrat, (2009) "Galvanische Legierung suberzuge als aktive Kathodenschichten mit geringer Wasserstoffuberspannung", Jahrbuch Oberflaechen technik, Electroplating alloy used as cathode active layers with low hydrogen overvoltage Yearbook Surface Technology, (65), pp. 37-55.

Extended EP Search Report.
Japanese Office Action.

* cited by examiner

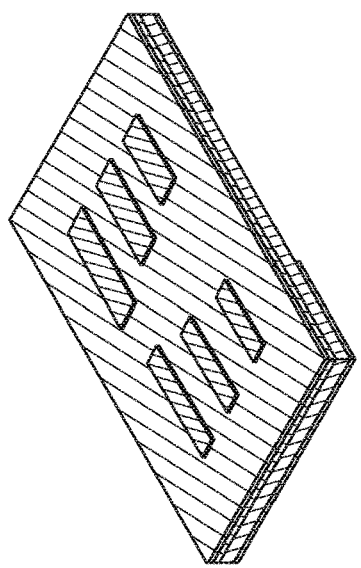
(100) Si WAFER WITH
300 nm Si₃N₄
FIG. 7A
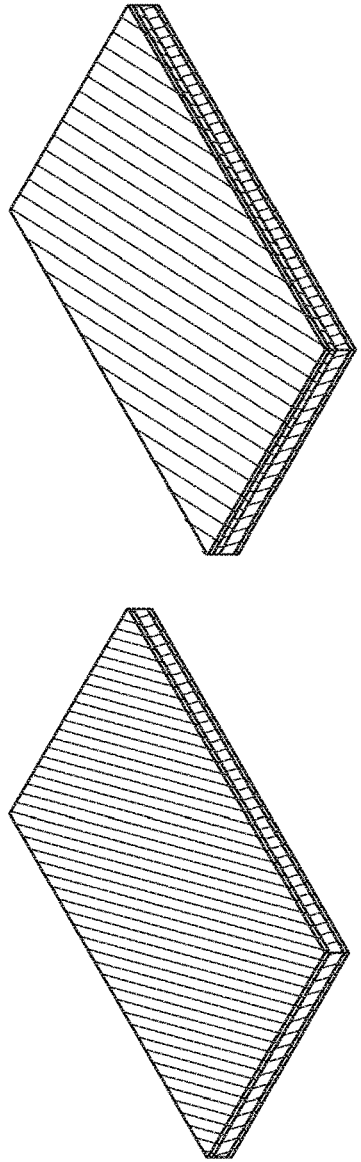
Ni-Mo-W DEPOSITION
FIG. 7B
FRONT & BACK SIDE
PHOTOLITHOGRAPHY
FIG. 7C
FRONT SIDE WET ETCH &
BACK SIDE RIE
FIG. 7D
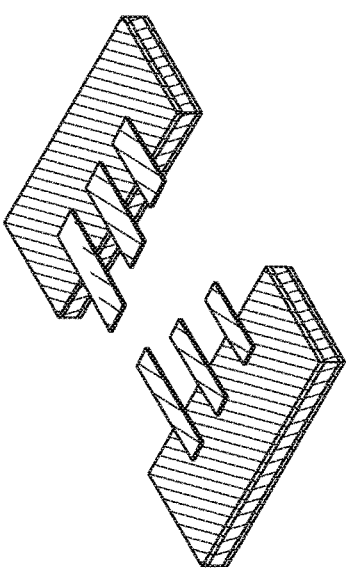
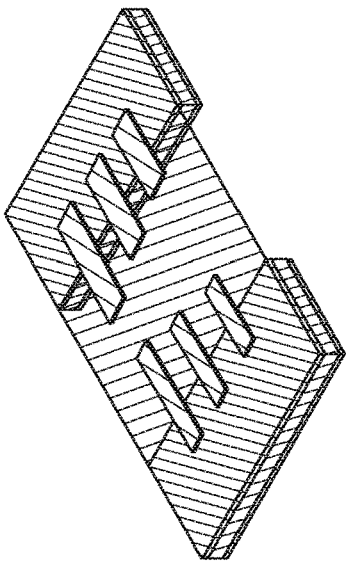
BACK SIDE Si ETCH
FIG. 7E
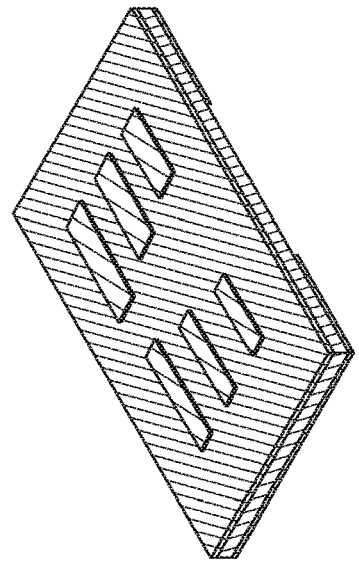
RIE TO RELEASE FILM
FIG. 7F
Si    Si₃N₄    S1813    Ni-Mo-W

METHOD OF DEPOSITING NANOTWINNED NICKEL-MOLYBDENUM-TUNGSTEN ALLOYS

CROSS-REFERENCE TO RELATED APPLICATIONS

This application is a 35 U.S.C. § 371 U.S. national entry of International Application PCT/US2018/030384 having an international filing date of May 1, 2018, which claims the benefit of U.S. Provisional Application No. 62/492,558, filed May 1, 2017, the content of each of the aforementioned applications is herein incorporated by reference in their entirety.

GOVERNMENT SUPPORT

This invention was made with government support under GOALI DMR-1410301 awarded by the National Science Foundation. The government has certain rights in the invention.

FIELD OF THE INVENTION

The present invention relates to metallic coatings and materials for thin film devices. More particularly the present invention relates to methods of depositing nanotwinned nickel-molybdenum-tungsten alloys with high strength, mechanical and thermal stability and an attractive balance of physical properties.

BACKGROUND OF THE INVENTION

Micro-electro-mechanical systems (MEMS) are used in numerous consumer-based products including inertial sensors (accelerometers and gyroscopes), pressure sensors, digital light projectors, mechanical filters and RF resonators. MEMS devices would be very useful in extreme environments and especially at elevated temperatures, where potential future applications include: micro power generation, high frequency switches and sensors, and digital monitoring and control of residential and commercial components in what is often referred to as the "Internet of Things". Such devices are not widely available, because these applications demand the development of advanced materials with greater strength, density, electrical and thermal conductivity, dimensional stability, and microscale manufacturability. MEMS materials with this suite of properties are not currently available.

Most commercial MEMS devices rely on silicon (Si), which cannot be used at elevated temperatures. Significant junction leakage occurs at temperatures above 120° C., and the mechanical behavior of silicon (brittle at low temperatures and poor creep strength at elevated temperatures) creates other design problems. Ceramics such as silicon dioxide ($SiO_2$), silicon nitride ($Si_3N_4$), silicon carbide (SiC) and silicon-carbo-nitride (Si—C—N), have been developed for MEMS devices that can operate in extreme environments. Some use of these materials has been realized, but wide application has been limited by high residual stresses and the complexity of the fabrication processes.

Furthermore, many advanced MEMS applications require materials with both high electrical conductivity and mechanical integrity. Electrodeposited LIGA (a German acronym for lithography, electroplating and molding) Ni offers a route for microfabrication of metallic parts with high aspect ratios and a more balanced set of properties, but LIGA Ni components have been shown to have highly variable properties that depend on electro-deposition parameters and change rapidly with thermal exposure. Nanocrystalline LIGA Ni possesses good room temperature yield strength, but instabilities at temperatures as low as 200° C. lead to grain growth and a significant loss of strength.

Aluminum thin films have found application in micromirror arrays, and bulk metallic glasses offer easily adaptable and economic processing route. However, both are still limited by their temperature capacity. As such, recent attentions have shifted towards nickel alloys that are suitable for thin film applications and offer the potential to optimize high temperature strength. Studies on electrodeposited nickel alloys with iron or cobalt showed that the mechanical properties could be significant improved through grain refinement. However, the major challenge of plating Ni, Co, and Fe was achieving the predetermined composition due to anomalous co-deposition of less noble metal. In addition, while Ni—Fe alloy showed high tensile strengths approaching 2 GPa, co-deposited sulfur migrated into grain boundaries when heat treated above 300° C. Compositionally modulated nanostructure Ni—Mn alloys have been developed to obviate these problems and demonstrated room temperature yield strength of 1250 MPa. Recently, several literatures reported that addition of small amounts of tungsten in solid solution significantly improves thermal stability and mechanical behavior. Based on the improved mechanical strength and stability, GEGR patented the design of micro-switch structure using electroplated nickel alloys. While electroplating has the advantage of depositing films in a fast rate, it is a challenge to achieve the predetermined chemical composition without impurity elements being co-deposited. Sputter deposition is an alternate method with better control of the composition, and Ni-base superalloys consisting of seven elements can be deposited with identical composition to the bulk. Further development of highly engineered metallic alloys that can be sculpted with submicron resolution would offer a wider range of functionality and fuel a greatly expanded assortment of MEMS applications.

It would therefore be advantageous to provide a method for depositing a strong, temperature resistant alloy with requisite physical properties (e.g. low thermal expansion and high electrical and thermal conductivity) in thin film or coating form. Elevated temperature MEMS materials and devices would be particularly useful for: aviation, automotive, power generation, sub-sea drilling, and chemical processing industries, in which MEMS sensing and guidance in such harsh environments would provide enhanced feedback and control.

BRIEF DESCRIPTION OF THE FIGURES

FIGS. 7A-7F illustrate schematics of the microfabrication steps and workflow that are used to process micro-cantilever test structures from Ni—Mo—W thin films.

SUMMARY

Figure 1A:
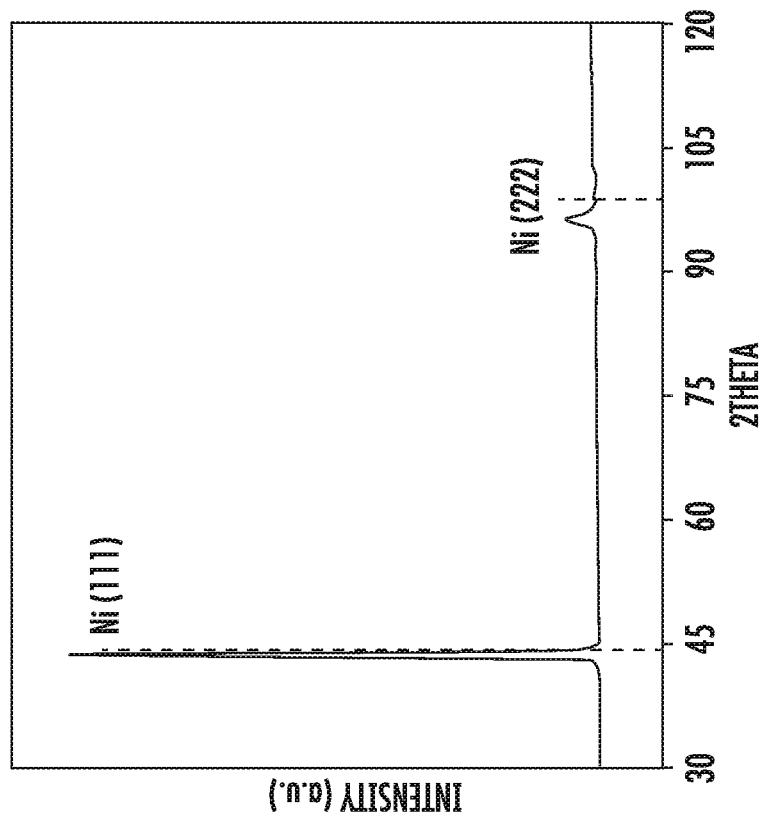
FIG. 1A illustrates a graphical view of the elemental content of the alloy as measured with an SEM-EDS spectrum of the as-deposited Ni—Mo—W film.

The foregoing needs are met, to a great extent, by the present invention, wherein in one aspect a film includes an alloy of nickel (Ni), molybdenum (Mo), tungsten (W) (Ni—Mo—W) having thermal and mechanical stability, high density, predetermined electrical properties, and a structure of nanotwins.

According to an aspect of the present invention, the deposition of the alloy is achieved with direct current sputter deposition and results in a crystalline film with a <111> out-of-plane crystallographic textured and a high density of planar defects. The as-deposited Ni—Mo—W films have a tensile strength greater than 2.5 GPa and generally in a range of 2.5-3.5 GPa. The film is microstructurally stable and does not coarsen when exposed to stresses as high as 3.4 GPa or temperatures as high at 600° C. The film can be generated with a coefficient of thermal expansion that is lower than that for pure Ni. The film can be generated with an electrical conductivity that is similar to the alloy in bulk coarse-grained form. The film can be deposited as a protective coating whose mechanical strength, stability and hardness provide excellent tribological protection against friction and wear. The method can also include heat treating the film to modify the mechanical properties in a way that provides a desired balance of strength and toughness. For example, thermal annealing for 1 hour at 1,000° C. results in films with 1.2 GPa tensile strength and 9% tensile ductility.

According to an embodiment of the present invention, a method of forming a nickel-molybdenum-tungsten (Ni—Mo—W) film includes sputter depositing Ni—Mo—W with a composition and manner that generates a nanotwin structure, thermal and mechanical stability, high density, low coefficient of thermal expansion (CTE), and electrical conductivity similar to bulk alloys.

According to another embodiment of the present invention, the method can include depositing the Ni—Mo—W using sputter deposition. More particularly, the sputter deposition can take the form of direct current magnetron sputter deposition. The method of deposition can also take the form of electro-deposition. The method includes generating a crystallographic structure possessing a strong <111> crystallographic texture and a high density of nano-scale planar defects (stacking faults and twins) oriented in the plane of the film. The method includes generating the film with a tensile strength above 2.5 GPa. Additionally, the method includes generating the film such that it is microstructurally stable and does not coarsen when exposed to stresses as high as 3.4 GPa or temperatures as high at 600° C. The film can be generated with a coefficient of thermal expansion that is lower than that for pure Ni. The film can be generated with an electrical conductivity that is similar to the alloy in bulk coarse-grained form. The film can be deposited as a protective coating whose mechanical strength, stability and hardness provide excellent tribological protection against friction and wear. The method can also include heat treating the film to modify the mechanical properties in a way that provides a desired balance of strength and toughness. For example, thermal annealing for 1 hour at 1,000° C. results in films with 1.2 GPa tensile strength and 9% tensile ductility.

DETAILED DESCRIPTION OF THE PREFERRED EMBODIMENTS

The presently disclosed subject matter now will be described more fully hereinafter with reference to the accompanying Drawings, in which some, but not all embodiments of the inventions are shown. Like numbers refer to like elements throughout. The presently disclosed subject matter may be embodied in many different forms and should not be construed as limited to the embodiments set forth herein; rather, these embodiments are provided so that this disclosure will satisfy applicable legal requirements. Indeed, many modifications and other embodiments of the presently disclosed subject matter set forth herein will come to mind to one skilled in the art to which the presently disclosed subject matter pertains having the benefit of the teachings presented in the foregoing descriptions and the associated drawings. Therefore, it is to be understood that the presently disclosed subject matter is not to be limited to the specific embodiments disclosed and that modifications and other embodiments are intended to be included within the scope of the appended claims.

The present invention is directed to the synthesis of metallic nickel-molybdenum-tungsten films with direct current sputter deposition, which results in fully-dense crystallographically textured films that are filled with nano-scale faults and twins. The deposition can also take the form of electro-deposition. The as-deposited films exhibit linear-elastic mechanical behavior and tensile strengths exceeding 3 GPa, which is unprecedented for materials that are compatible with wafer-level device fabrication processes. The ultra-high strength is attributed to a combination of solid solution strengthening and the presence of dense nanotwins. These films also possess excellent thermal and mechanical stability, high density, low CTE and electrical properties that are attractive for next generation metal MEMS applications.

The Ni—Mo—W thin films, according to an embodiment of the present invention, are deposited using custom-built magnetron sputter deposition systems with a base pressure of $1 \times 10^{-7}$ Torr. The sputter deposition is used because it is compatible with photolithography-based liftoff and etching techniques that can be employed to shape micro-scale cantilevers and MEMS devices. Films are sputtered using DC powers ranging from 200-2500 W and argon working pressure in the range of 1-3 mTorr. The Ar pressure and DC power is carefully chosen to achieve films with low residual stress and ensure a dense microstructure without surface micro cracks. Any other suitable method and criteria for deposition could also be used.

In an exemplary implementation of the method described that is illustrative and not meant to be considered limiting, two targets, Ni—15 at % Mo and Ni—15 at % W, were co-sputtered on a brass substrate to create films with compositional spread and a relatively molybdenum rich (compared to tungsten) region was selected to demonstrate its properties. Freestanding thin films were achieved by peeling off the films from the brass substrate and cut into tensile geometries using wire electrical discharge machining (EDM). The NiMoW tensile specimens sputter deposited at a power of 2500 W with 1 mTorr argon pressure had an average thickness of 29 μm, gauge widths of 465 μm, and gauge lengths of 1.6 mm.

Figure 1B:
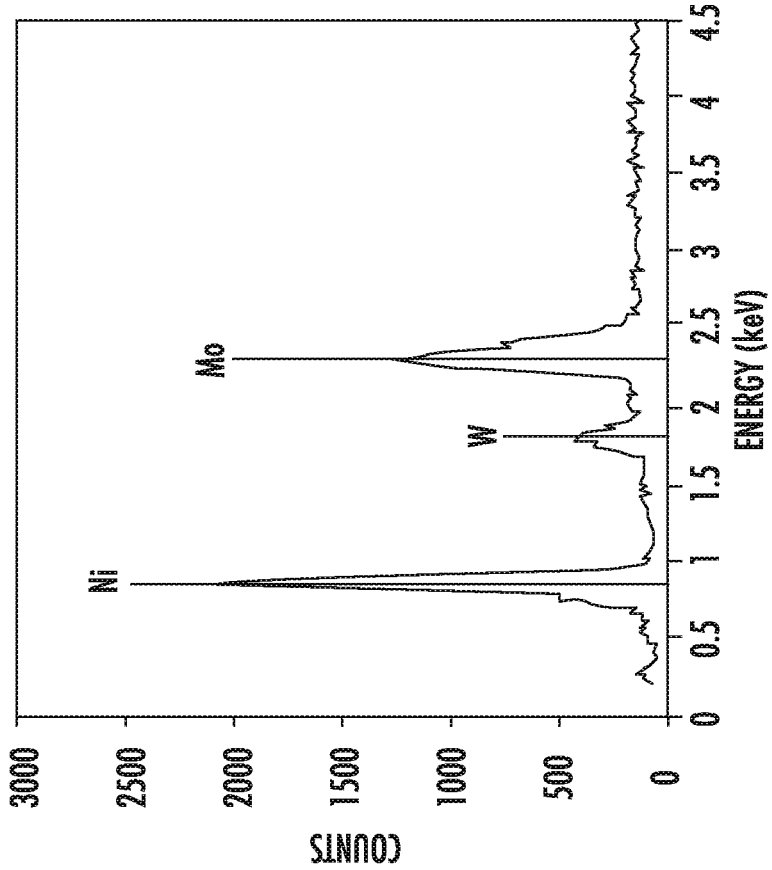
FIG. 1B illustrates a graphical view of an XRD scan showing a strong (111) out of plane texture for the as-deposited Ni—Mo—W film.

The chemistry of the as-deposited films was measured using energy-dispersive spectroscopy in a CM300 transmission electron microscope, as illustrated in FIG. 1A and wavelength dispersive X-ray spectroscopy in a JEOL 8600 Superprobe with pure Ni, Mo and W crystals serving as standards. Operating conditions for WDS included 40° take-off angle, a beam energy of 20 keV, a beam current of 40 nanoAmperes, and a beam diameter of 2 microns. FIG. 1A illustrates a graphical view of an SEM-EDS graph of the as-deposited Ni—Mo—W film. FIG. 1B illustrates a graphical view of an XRD result showing a strong (111) out of plane texture for the as-deposited Ni—Mo—W film. Sixteen point measurements were made at different regions of the film, and the average chemical composition of the alloy was determined to be $Ni_{83.6}Mo_{14}W_{2.4}$ (atomic percent). A Struers twin jet electropolisher and an electrolyte of 15 vol. % perchloric acid and 85 vol. % ethanol was used for in-plane TEM sample preparation and focused ion beam (FIB, FEI Strata DB235) lift-out was used to obtain cross-sectional TEM foils. TEM images were acquired using a Philip CM 300 microscope at 300 kV. The crystal orientation of the films was assessed using XRD, and further confirmed using TEM orientation mapping technique based on collection of automated crystal orientation mapping.

Tensile specimens were pulled at room temperature using a custom-designed microtensile load frame consisting of a micro actuator, 25 lb load cell, air bearing and a Pixelink digital camera. The nominal strain rate during testing was $2 \times 10^{-5}$ s$^{-1}$. Images of the gauge section were taken every 1 second to capture the surface image of the sample during loading. These images were post-processed using digital image correlation (DIC) technique to accurately measure the strain in the gauge length during loading. Instrumented nanoindentation was performed to measure hardness of the film at different strain rates using an iNano (Nanomechanics inc.) with a diamond Berkovich tip. The Oliver-Pharr method was used to extract hardness from the nanoindentation load-displacement curves. All indentations were performed at constant indentation strain rates defined as $$\dot{\varepsilon} = \frac{1}{h}\frac{\partial h}{\partial t} = \frac{1}{2}\left(\frac{1}{P}\right)\frac{\partial P}{\partial t}, \quad (1)$$

where h is indentation depth, t is time, and P is the applied load. Hardness data presented in Table 1 is the average of over 36 indentations at each strain rate.

Table I, below, shows chemical composition, elastic modulus, tensile strength, hardness, and activation volume of the sputter deposited Ni—Mo—W film obtained from WDS, microtensile, and nanoindentation tests.

TABLE I

| Composition | Elastic modulus | Tensile strength | Hardness (GPa) | | | Activation Volume |
|---|---|---|---|---|---|---|
| (at. %) | (GPa) | (GPa) | 0.05 s$^{-1}$ | 0.2 s$^{-1}$ | 1 s$^{-1}$ | (b$^3$) |
| $Ni_{83.6\pm0.2}Mo_{14\pm0.2}W_{2.4\pm0.1}$ | 221 ± 5 | 3.4 ± 0.3 | 8.95 ± 0.82 | 9.1 ± 0.91 | 9.24 ± 0.86 | 19.6 |

Figure 2B:
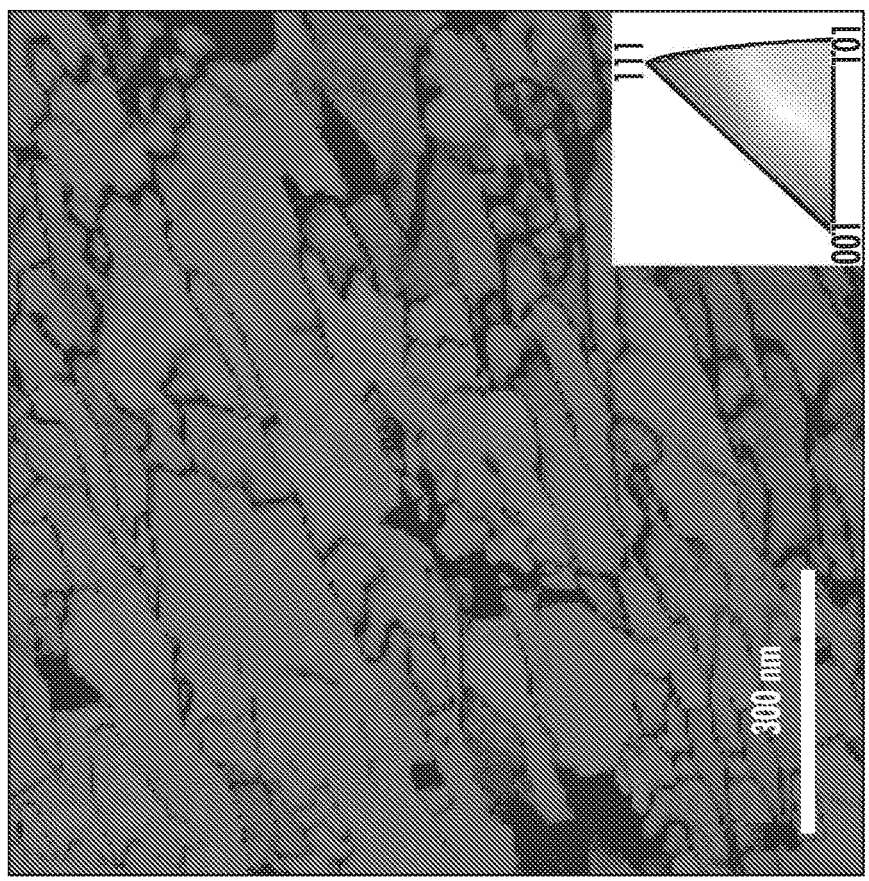
FIG. 2A illustrates a bright-field plane view TEM image and FIG. 2B illustrates an orientation map of the film collected using TEM-based automated crystal orientation mapping (ACOM).
Figure 2A:
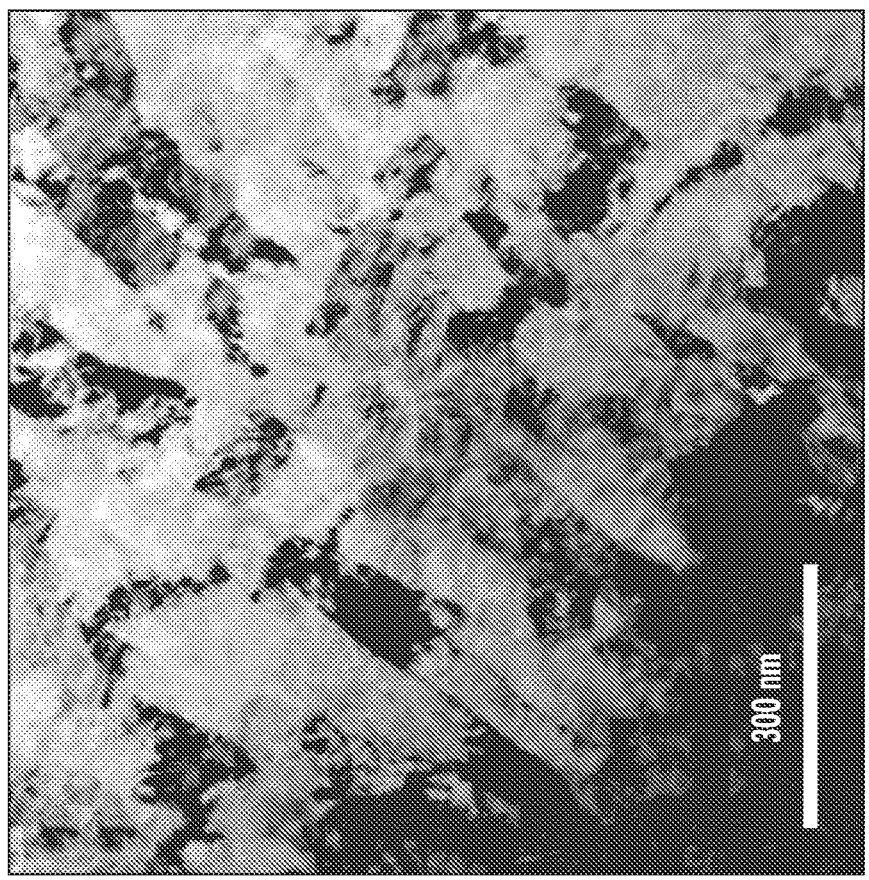

In an exemplary implementation of the present invention, single-phase solid solution nickel-molybdenum-tungsten (Ni—Mo—W) alloy films were fabricated with an average thickness of 29 μm by means of high-power, direct current sputter deposition with deposition rate of 11.6 μm per hour. The chemistry of the as-deposited films was measured using energy-dispersive spectroscopy, as illustrated in FIG. 1A and wavelength dispersive X-ray spectroscopy (Table I), and the composition of the films was determined to be $Ni_{83.6}Mo_{14}W_{2.4}$ (atomic percent), which exceeds the equilibrium solubility limit of Mo in Ni. Nevertheless, X-ray diffraction scans, illustrated in FIG. 1B, transmission electron microscopy (TEM) observations, in FIG. 2A, and TEM-based crystal orientation maps, in FIG. 2B, indicate that the as-deposited film is a single-phase solid solution alloy. FIG. 2A illustrates a bright-field plane view TEM image and FIG. 2B illustrates a TEM-based orientation map collected using automated crystal orientation mapping (ACOM). The sputtering process resulted in a preferred (111) out-of-plane crystallographic texture and a far-from-equilibrium supersaturated single-phase microstructure. Similar phenomena have been reported for sputter deposited and pulse laser deposited thin films. The XRD peaks for the solid solution are uniformly shifted as compared to reference Ni peaks, which is attributed to extended lattice spacing due to the incorporation of Mo and W atoms into the Ni lattice.

Figure 3C:
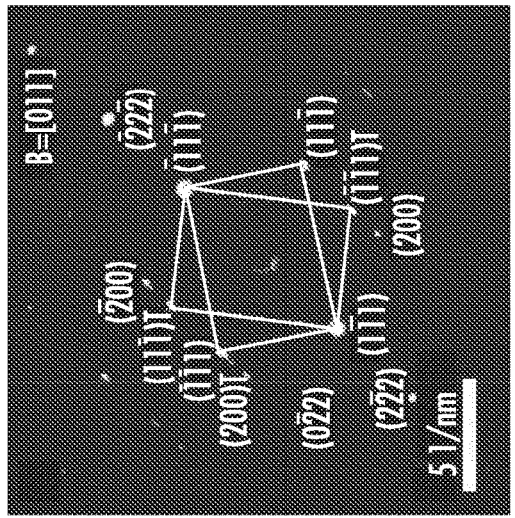
FIG. 3C illustrates a corresponding SAED pattern indexed for matrix and twin orientations.
Figure 3F:
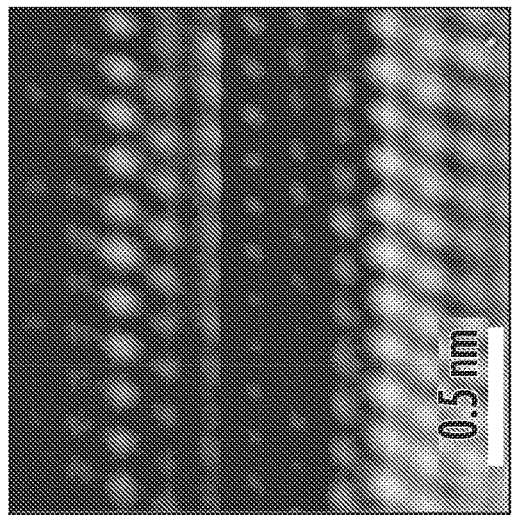
FIG. 3F illustrates a magnified view focusing on a few planar defects with better clarity.
Figure 3B:
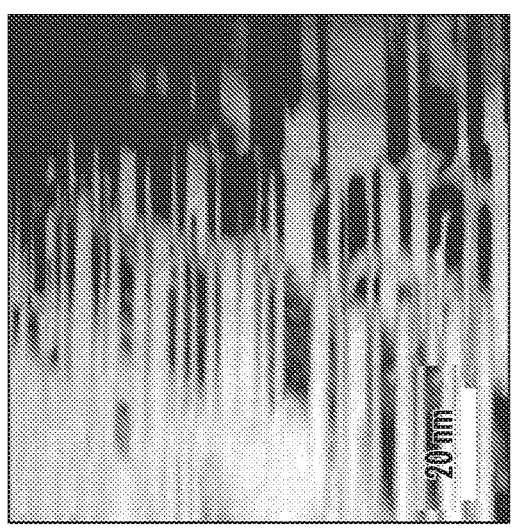
FIG. 3B illustrates a higher magnification bright-field cross-sectional TEM micrograph showing planar defects.
Figure 3E:
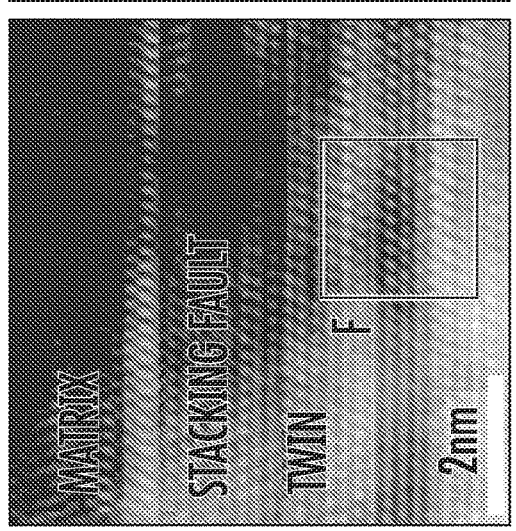
FIG. 3E illustrates a HRTEM image showing stacking faults and nano-twin lamellae on (111) planes.
Figure 3A:
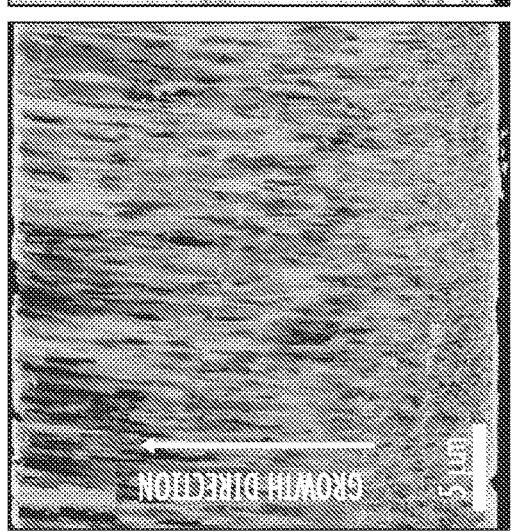
FIG. 3A illustrates a cross-sectional channeling contrast image, showing the columnar microstructure of the deposited film.
Figure 3D:
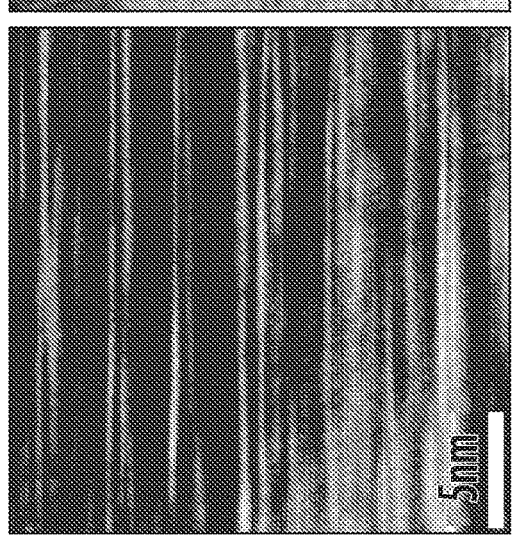
FIG. 3D illustrates a HRTEM image taken along the [011] zone axis and revealing high density planar defects.

Cross-sectional focused ion beam (FIB) observations, in FIG. 3A, revealed the as-deposited films to have a columnar microstructure as is commonly observed in high-melting temperature materials when sputter-deposited at room temperature. The columnar grains were found to be densely packed without intergranular voids, and cross-sectional TEM images of the as-deposited films, like in FIG. 3B, revealed an extremely high density of planar crystallographic defects (twins and stacking faults) within the columnar grains. These planar defects are oriented along {111} planes that lie parallel to the film surface and growth direction, and their spacing is extremely fine (1.8±1.1 nm), as illustrated in FIGS. 3E and 3F. FIG. 3A illustrates a cross-sectional channeling contrast image, showing the columnar microstructure of the deposited film. FIG. 3B illustrates a bright-field cross-sectional TEM micrograph. FIG. 3C illustrates a corresponding SAED pattern indexed for matrix and twin orientations. FIG. 3D illustrates a HRTEM image taken along the [011] zone axis and revealing high density planar defects. FIG. 3E illustrates a HRTEM image showing stacking faults and nano-twin lamellae on (111) planes. FIG. 3F illustrates a magnified view focusing on a few planar defects with better clarity.

Figure 4:
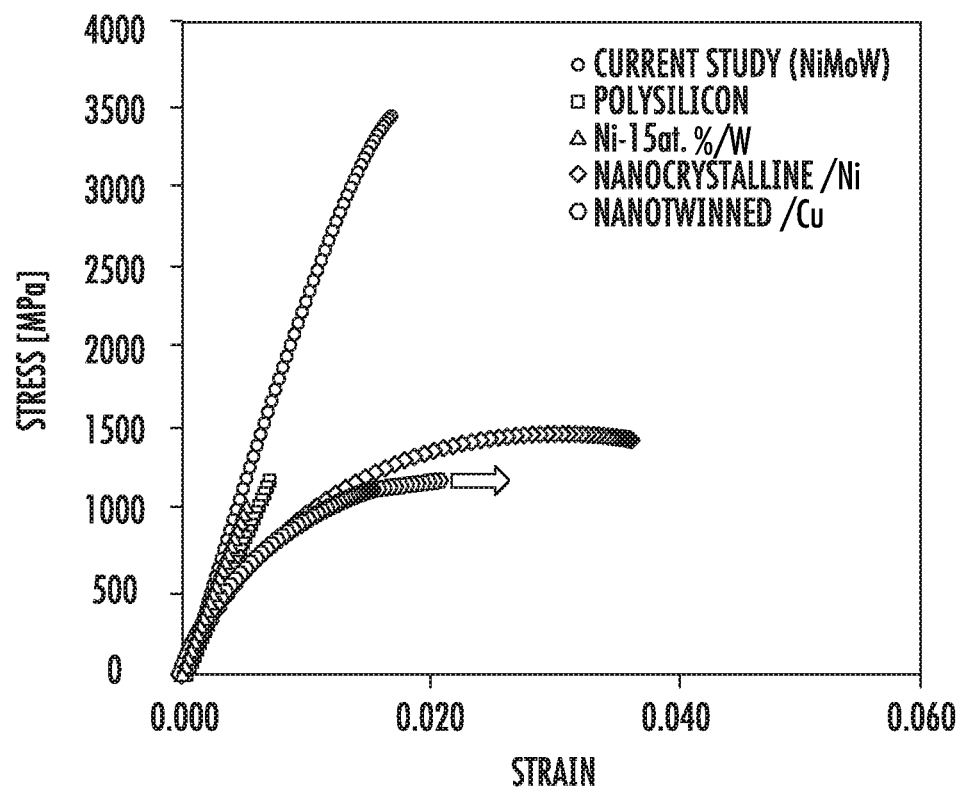
FIG. 4 illustrates a graphical view of tensile stress-strain curves of three Ni—Mo—W thin films compared with previously reported nano-crystalline Ni, nanocrystalline Ni—W alloy, nanotwinned Cu, and polysilicon thin films.

Uniaxial tensile tests were performed on freestanding $Ni_{83.6}Mo_{14}W_{2.4}$ thin films, and the stress-strain response of these sputtered films is compared with literature values of nanoscale metals and other candidate MEMS materials in FIG. 4. FIG. 4 illustrates a graphical view of tensile stress-strain curves of three Ni—Mo—W thin films compared with previously reported nano-crystalline Ni, nanocrystalline Ni—W alloy, nanotwinned Cu, and polysilicon thin films. The linear-elastic response and ultra-high strength are highly desirable for MEMS applications. Exceptionally high tensile strengths, as high as 3.4 GPa, were measured for the $Ni_{83.6}Mo_{14}W_{2.4}$ films, without sign of significant plastic deformation. This linear-elastic response is highly desirable for MEMS applications, and the overall strength is a significant improvement over pure nanocrystalline Ni or binary Ni—W alloys. The tensile strengths of nanotwinned Cu thin foils with a similar (111) out-of-plane texture, polysilicon (still one of the most widely used MEMS materials), and single crystal silicon are also much lower than the sputter deposited $Ni_{83.6}Mo_{14}W_{2.4}$ films. A few materials (e.g. nanowhiskers, Co and Fe based metallic glasses, and heavily drawn steel wires) have been reported to possess similar or higher strengths. However, ultrahigh strength whiskers and wires cannot easily be shaped into MEMS components, and while micro-molded bulk metallic glasses hold promise at low temperatures, they will likely not be suitable for elevated temperature applications.

For a <111> textured fcc thin film, the elastic modulus E (111) is isotropic within the film plane and can be calculated from the single-crystal elastic constants using $$E(111) = \frac{4}{2s_{11} + 2s_{12} + s_{44}} = \frac{4}{2(0.00734) + 2(-0.00274) + 0.00802} = 232 \text{ GPa}, \quad (2)$$

where $s_{ij}$ represents the compliance constants. This value of 232 GPa is based on single crystal elastic constants of bulk Ni, and the addition of Mo and W has been predicted to cause a slight increase in modulus. However, the elastic modulus derived from the uniaxial tensile tests performed in this study is 221 GPa, which is 5% lower than the bulk value. Decreased elastic moduli for vapor-deposited metals have been reported and attributed to a variety of factors. TEM images of the sputtered films rule out the influence of micro-cracks in the present study. The 5% decrease is likely related to minor variations in thickness or crystallographic texture.

The activation volume $\Omega^*$ was calculated from the rate sensitivity of hardness using the equation below and can be used to characterize thermally activated deformation processes.

$$\Omega^* = 3\sqrt{3} k_B T \frac{\partial \ln \dot{\varepsilon}}{\partial H}, \quad (3)$$

where $k_B$ is the Boltzmann constant, T is the temperature, $\dot{\varepsilon}$ is strain rate, and H is the hardness of the film. The activation volume of coarse grained polycrystalline FCC metals is ~1,000 $b^3$ (where the magnitude of the Burgers vector b=0.25 nm for Ni) and less than 20 $b^3$ when nanocrystalline and nanotwinned. Activation volumes for the $Ni_{83.6}Mo_{14}W_{2.4}$ films was measured to be below 20 $b^3$ (Table I), which is consistent with nanotwins governed deformation.

The microstructure of the as-deposited films, single-phase solid solution alloy with a strong {111} texture and an ultra-high density of finely spaced nanotwins, led to the consideration of both solid solution strengthening and twin boundary strengthening.

The strengthening increment caused by local dislocation-solute interactions is:

$$\Delta \sigma_{Fleischer} = M \cdot \Delta \tau_{Fleischer} = M \cdot A \cdot G_{solvent} \cdot \varepsilon_S^{3/2} \cdot c^{1/2} \quad (4)$$

where M is the Taylor factor (3.67 (50) assuming a perfect (111) textured polycrystalline film), A is a fitting constant (0.0235), G is the shear modulus (76 GPa), and c is the atomic fraction of the solute. $\varepsilon_S$ represents the interaction parameter that accounts for the local resistance to dislocation propagation coming from changes in the lattice parameter and shear modulus in the vicinity of a solute atom:

$$\varepsilon_S = \left| \frac{\frac{1}{G_{solvent}} \frac{\partial G}{\partial c}}{1 + \frac{1}{2} \left| \frac{1}{G_{solvent}} \frac{\partial G}{\partial c} \right|} - 3 \frac{1}{b_{solvent}} \frac{\partial b}{\partial c} \right|. \quad (5)$$

Substituting known values for Ni gives a strengthening increment of 593 MPa.

Figure 5:
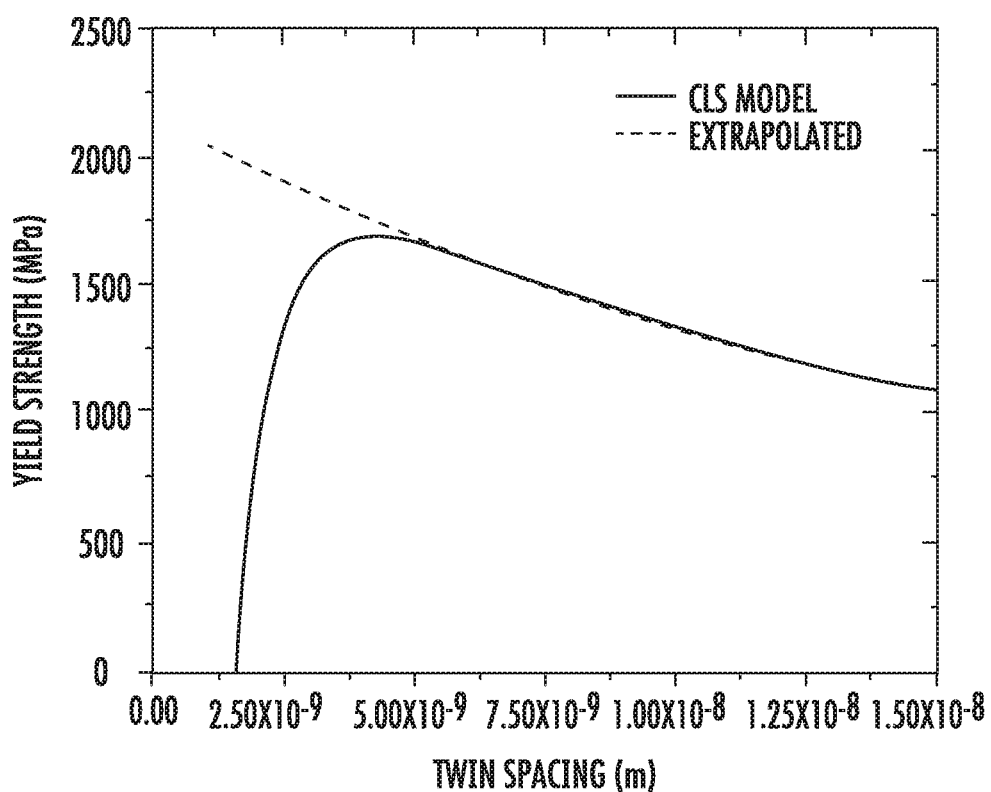
FIG. 5 illustrates a graphical view of yield strength predicted from the confined layer slip model.

The widely employed Hall-Petch relationship predicts the yield strength of a material when dislocations pile-up against grain boundaries. Here, instead of piling up at twin boundaries the dislocations are expected to bow between twins in a manner similar to threading dislocations observed in thin films and multilayered materials. In this scenario, the strength increase originating from nanotwins can be predicted from the confined layer slip (CLS) model:

$$\Delta \sigma_{Nanotwins} = \sigma_0 + \beta \frac{Gb}{\lambda} \ln\left(\frac{\alpha \lambda}{b}\right) \quad (6)$$

where $\sigma_0$ is lattice friction stress (37 MPa), $\lambda$ is the twin thickness, and $\alpha$, $\beta$ are material constants. Since $\alpha$, $\beta$ for nanotwinned Ni has not been reported, the value reported for Ti/Ni multilayer thin films ($\alpha$=0.16, $\beta$=0.37) was used. Solid solution additions are expected to affect the strength by changing the lattice parameter and shear modulus of the solvent, without change in the deformation mechanism. Strengthening increment from solid solution addition can be calculated as:

$$\Delta\sigma_{Nanotwins,SS} \approx \beta \frac{Gb}{\lambda} \ln\left(\frac{\alpha\lambda}{b}\right) \cdot \left(\frac{1}{G_{solvent}} \frac{\partial G}{\partial c} + \frac{1}{b_{solvent}} \frac{\partial b}{\partial c}\right) \cdot c \quad (7)$$

when higher order terms are neglected. The log term becomes negative if the twin spacing is less than 4 nm, which is the case for our films. In order to predict the CLS stress for average twin spacing of 1.8 nm, CSL stresses calculated at larger twin spacing are extrapolated (using exponential curve fitting) to smaller twin spacing (FIG. 5).

These mechanisms are expected to operate in parallel, and the total strength of the nanotwinned solid solution films can be approximated by summing the influence of each mechanism. The total yield strength is then predicted to be:

$$\sigma_{YS,film} = \Delta\sigma_{Fleischer} + \Delta\sigma_{Nanotwins} + \Delta\sigma_{Nanotwins,SS} = 593 + 1{,}972 + 300 = 2{,}865 \text{ MPa} \quad (8)$$

which is close to the measured tensile strengths (FIG. 4 and Table I). The agreement of the model with the experimental results, suggests that the model may be used to establish the potency of the various strengthening mechanisms, and the presence of the nanotwin structure clearly has the greatest effect.

The remarkable mechanical behavior of the $Ni_{83.6}Mo_{14}W_{2.4}$ films can be attributed to their unique microstructure, namely extended solid solution solubility, textured columnar grains and finely spaced nanotwins, which are directly attributable to their atomic composition and the conditions under which they were deposited. Dislocations forced to bow out and run between twin boundaries predict the strength increase originating from the presence of the nanotwins using a confined layer slip (CLS) model that has been modified to include the local changes in the lattice parameter and elastic modulus. Because these dislocation processes act in parallel, the strength of the thin films can be estimated by summing the strengthening mechanisms, and using appropriate parameters for nanotwinned Ni—Mo—W gives Eq. 8. Thus, the estimated yield strength is close to the measured tensile strength, and comparison of the various terms indicates that the ultra-high strength of these films originates primarily from the presence of the nanotwins.

Figure 6A:
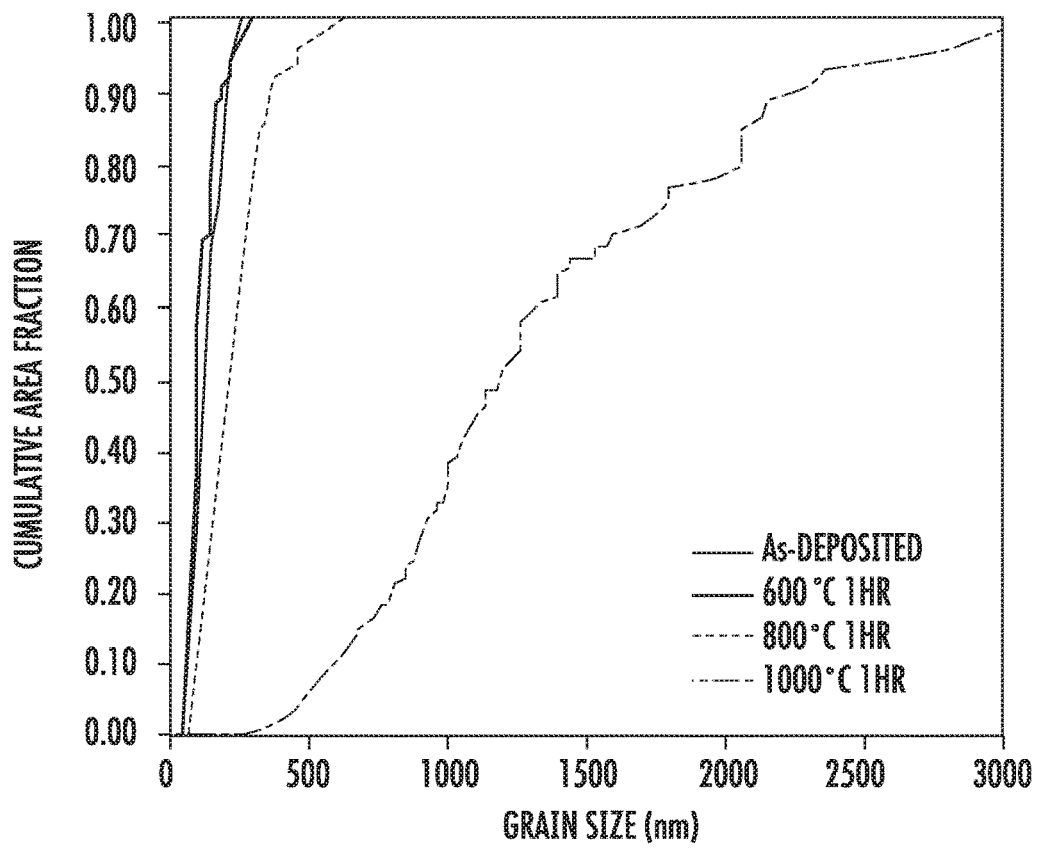
FIG. 6A illustrates a graphical view of a cumulative area fraction of the in-plane grain size of Ni—Mo—W films annealed at various temperatures.
Figure 6B:
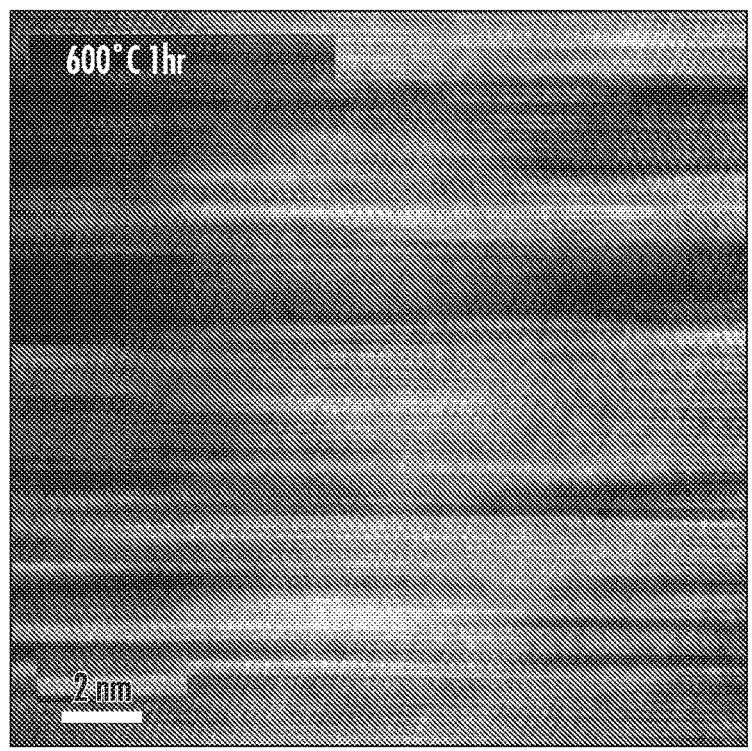
FIG. 6B illustrates a cross-sectional TEM image of the film annealed at 600° for 1 hour.
Figure 6D:
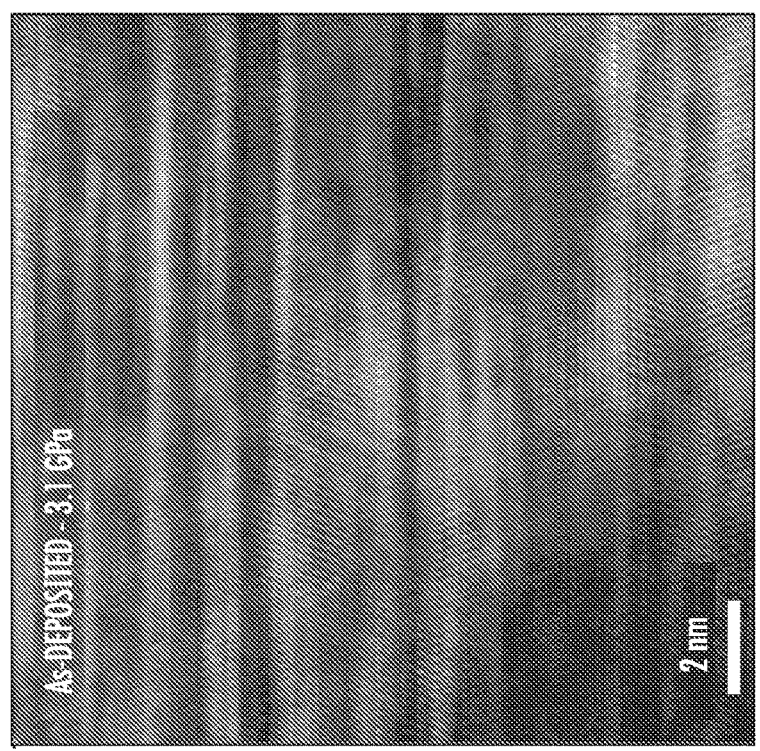
FIG. 6D illustrates a cross-sectional TEM image of a film that was loaded up to 3.1 GPa.
Figure 6C:
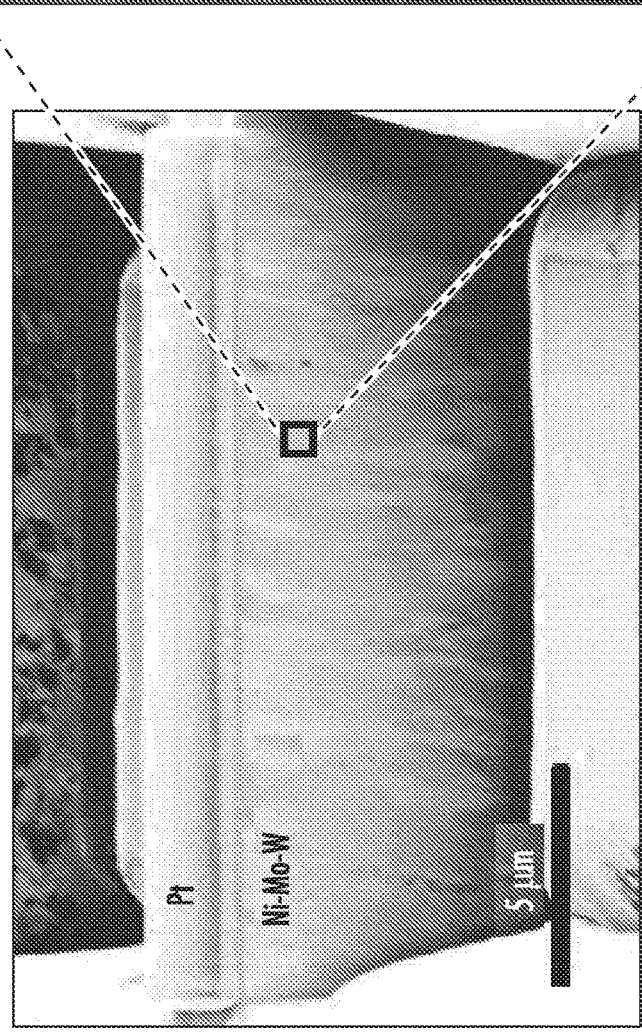
FIG. 6C illustrates FIB channeling contrast.

Dimensional stability is particularly important in capacitive-based sensors and guidance MEMS devices, where dimensional changes caused by microstructural evolution or thermal expansion must be significantly less than the expected changes induced during detection/operation of the device. Therefore, thermal and mechanical stability is a crucial requirement for materials that are to be considered for use in high-temperature MEMS applications. A series of annealing experiments were performed in high vacuum to observe whether the columnar structure and high-density nanotwins are retained after annealing. FIG. 6A shows the cumulative area fraction of the in-plane grain size of the film annealed at various temperatures for 1 hour. Surprisingly, the film annealed at 800° C. did not undergo significant grain growth. TEM cross-sectional images, in FIG. 6B, confirmed that the high-density nanotwins were also retained without noticeable change in twin spacing after annealing at 800° C. FIG. 6A illustrates a graphical view of a cumulative area fraction of the in-plane grain size of Ni—Mo—W films annealed at various temperatures. FIG. 6B illustrates a cross-sectional TEM image of the film annealed at 600° for 1 hour. FIG. 6C illustrates FIB channeling contrast, and FIG. 5D illustrates a cross-sectional TEM image of a film that was loaded up to 3.1 GPa. No obvious changes in the columnar microstructure or twin size/spacing were observed. Only limited grain growth was observed after annealing at 800° C. and extensive grain growth only occurred when the $Ni_{83.6}Mo_{14}W_{2.4}$ films were annealed at 1000° C. FIGS. 6C and 6D are FIB channeling contrast and cross-sectional TEM images, which show that the columnar grains and high-density nanotwins were retained even after loading up to 3.1 GPa. By comparison, pure nanocrystalline nickel showed significant grain growth and microstructural instability when annealed above 200° C. for 1 hour (34) and when mechanically loaded up to 1.7 GPa (35). The unusual thermal and mechanical stability of the $Ni_{83.6}Mo_{14}W_{2.4}$ films, as compared to nanocrystalline nickel, can be attributed to: (i) the presence of nanotwins, which have been reported to have better thermal stability than high-angle grain boundaries, and ii) the supersaturated single-phase structure. Alloying has been shown to improve stability of nanocrystalline materials, and recent studies indicate that microstructural stability can be correlated to solute enrichment at the grain boundaries. In addition to microstructural stability, coefficient of thermal expansion (CTE) measurements have been performed using a custom optical DIC strain measurement technique. The room temperature CTE for the $Ni_{83.6}Mo_{14}W_{2.4}$ films was measured to be $10.7 \times 10^{-6}$ $C^{-1}$, which is 22% lower than for pure nickel.

The electrical resistivity of the $Ni_{83.6}Mo_{14}W_{2.4}$ films measured using a four-point resistivity measurement setup is 111.7 $\mu\Omega \cdot cm$, which is comparable to 112 $\mu\Omega \cdot cm$ measured for electroless plated $Ni_{83.6}Mo_{14.9}P_{1.5}$ films. It also lies in the same range as bulk nickel-molybdenum alloys (118~135 $\mu\Omega \cdot cm$), nickel-chromium alloys (103~129 $\mu\Omega \cdot cm$), and nickel-base superalloys (120~133 $\mu\Omega \cdot cm$). The electrical resistivity is summarized in Table II and Table III. Electrical resistivity of a metallic alloy is governed by electron scattering due to obstacles such as vacancies, dislocations, grain boundaries, and impurities. The as-deposited films consist of micron-scale columnar grains filled with extremely fine nanotwins, but their resistivity is comparable or even lower than coarse-grained nickel alloys. This emphasizes the fact that twin boundaries have a very minor effect on the electrical resistivity, while significantly improving the mechanical strength and stability.

TABLE II

|  | $Ni_{83.6}Mo_{14}W_{2.4}$ | $Ni_{83.6}Mo_{14.9}P_{1.5}$ | Ni—Mo alloys | Ni—Cr alloys | Ni-base superalloys |
| --- | --- | --- | --- | --- | --- |
| Electrical resistivity ($\mu\Omega \cdot cm$) | 111.7 | 112 | 118~135 | 103~129 | 120~133 |

TABLE III

Candidate alloys selected for electrical resistivity measurements across the compositional spread of Ni—Mo—W films.

| | Electrical resistivity ($\mu\Omega \cdot$ cm) |
|---|---|
| $Ni_{84.9}Mo_{2.1}W_{13}$ | 103.3 |
| $Ni_{85.4}Mo_{3.3}W_{11.3}$ | 103.4 |
| $Ni_{85.1}Mo_{4.6}W_{10.3}$ | 102.0 |
| $Ni_{85.4}Mo_{5.9}W_{8.7}$ | 100.9 |
| $Ni_{84.2}Mo_{8.9}W_{6.8}$ | 100.2 |
| $Ni_{84.4}Mo_{10.7}W_{4.9}$ | 98.1 |
| $Ni_{84.2}Mo_{11.8}W_{4.0}$ | 110.7 |
| $Ni_{85.2}Mo_{12.7}W_{2.1}$ | 103.9 |
| $Ni_{83.6}Mo_{14}W_{2.4}$ | 111.7 |

Thick (29 µm), thin films of single-phase, solid solution strengthened $Ni_{83.6}Mo_{14}W_{2.4}$ films were fabricated by means of high-power, direct current sputter deposition. Sputtering Ni with Mo and W that reduced its stacking fault energy, at unusually high deposition rates, resulted in the formation of a columnar highly-textured and nanotwinned microstructure. The as-deposited films possess linear elastic loading, exceptional dimensional stability, and tensile strengths greater than 3 GPa. Deformation models accredit the primary source of the exceptional strength to the presence of the ultra-fine nanotwins. The resultant combination of exceptionally high tensile strength with thermal and mechanical stability points to co-sputtered Ni—Mo—W films as a promising candidate for extending the application envelope for MEMS sensors and components.

The combination of exceptionally high strength with thermal and mechanical stability shows that nanotwinned Ni—Mo—W is a remarkable metal MEMS candidate for extending the application envelope of MEMS devices. This will involve micro-cantilever arrays and demonstration of requisite dimensional control and stability. Commercial deposition protocols must have broad processing windows to assure robust control of material composition, microstructure and properties. Blanket Ni—Mo—W films are patterned, etched and shaped to form freestanding arrays of micro-cantilevers that are representative of MEMS devices. The shape (curvature) and deflection of the micro-cantilevers are obtained with interferometry and used to measure and control residual stress and stress gradients as function of processing parameters, position on the wafer, thermal cycling and in service fatigue.

The unusual and highly attractive properties that were uncovered, including but not limited to tensile strength exceeding 3 GPa, microstructural thermal and mechanical stability and desirable physical properties, can be attributed to the formation of a columnar, highly-textured and very finely nanotwinned microstructure. The presence of the nanotwins is the key. Because of the high stacking fault energy of Ni, it is reasonable to assume that the use of sputter deposition and the Mo and W additions played synergistic roles in promoting nanotwin formation in the Ni—Mo—W films.

The stacking fault energy of Ni is significantly higher than Cu and austenitic stainless steel and is thought to preclude the formation of nanotwins in pure Ni, but alloying with Mo and W appears to significantly decrease the stacking fault energy and by so doing promote nanotwin formation. The addition of Mo and W was motivated by the desire to engineer a lower CTE; its influence on twin formation was somewhat fortuitous. Nevertheless, films have been deposited with compositions ranging from approximately $Ni_{85}Mo_{15-y}W_y$, where y varies from 1 to 14 atomic percent, and the nanotwins are visible across the entire composition range. This is very beneficial as it provides a wide processing window. The solubility of Mo and W in Ni may be affected by sputtering rate and further optimization is anticipated.

To demonstrate the ability to produce MEMS-scale devices, freestanding micro-cantilever arrays of various widths and lengths are fabricated from candidate blanket Ni—Mo—W films using standard microfabrication techniques. As illustrated schematically in FIG. 7A, the fabrication process starts with a (100) Si wafer coated on both sides with a 300 nm low-pressure chemical vapor deposited (LPCVD) $Si_3N_4$ film. First, a 1-5 µm-thick Ni—Mo—W film is sputter deposited on the front side, as illustrated in FIG. 7B. A positive photoresist (Shipley, S1813) is then spin-coated on the front and back sides of the wafer, soft-baked at 115° C. for 3 minutes, and exposed to UV using a Cr mask and lithography to pattern the shape of the cantilevers, as illustrated in FIG. 7C. Silicon nitride ($Si_3N_4$) is then selectively removed from the back side of the substrate in a reactive ion etch (RIE) process using $CF_4$, and the front side metallic alloy layer is patterned by wet etch using commercially available nickel etchants (e.g. Nickel Etchant TFB, Nickel Etchant TFG), as illustrated in FIG. 7D. To release the cantilever, the Si substrate is etched using a 30% potassium hydroxide (KOH) solution at 80° C., or by deep reactive ion etching (DRIE), as illustrated in FIG. 7E. In the final step of the fabrication process, the $Si_3N_4$ layer, which acts as an etch stop during KOH etching or DRIE, is removed by reactive ion etching with $CF_4$, as illustrated in FIG. 7F. FIGS. 7A-7F illustrate schematics of the microfabrication steps and workflow that are used to process micro-cantilever test structures from Ni—Mo—W thin films.

Another process to fabricate cantilever beams is to use $XeF_2$ etching. For instance, one can envision a one-layer structure defined in one lithography step, followed by a $XeF_2$ etch and release. Use of the $XeF_2$ etch is convenient because it etches Si quickly (~0.8 µm/min) and isotropically. Additionally, it has excellent selectivity for many materials (e.g. near infinite for photoresist and many metals, >1000:1 for oxide). Because of these properties, the $XeF_2$ etch process would provide a quick and easy way of releasing test structures for characterizing their dimensional stability.

Implementation of MEMS devices for industrial or commercial applications requires dimensional stability and wafer uniformity. The processing, microfabrication and bonding of these micro-devices can all affect stability and uniformity. Controlling stress gradients and residual stress in the sputter-deposited micro-cantilevers will be a pivotal step for ensuring device uniformity. Measurements can easily be done using an interferometer to measure the deflection of the freestanding cantilever beams via interferometry fringes. For a fixed end freestanding cantilever beam, the measured displacement can be used to calculate the takeoff angle and the curvature. More specifically, the interferometer measurements will yield beam displacement as a function of beam position. Differentiation of this data yields the takeoff angle, which corresponds to the residual stress in the film. Second order differentiation of the measured data yields the curvature, which accounts for the stress gradients in the freestanding cantilever. Using the extrapolation of the takeoff angle on the end of the cantilever allows one to decouple the stress gradient from the residual stress.

As-fabricated device characterization is useful as a baseline measurement, but a more practical engineering question is whether the residual stresses and thus the geometry of the cantilever will change as a result of the temperature cycles associated with both packaging and elevated temperature service. The bonding processes for packaging MEMS devices are done at various temperatures, e.g. 260° C. for solder reflow, 350° C. for thermocompression and 410° C. for glass frit bonding. Repeated 1-hour thermal cycles to 350° C. and 410° C. and post mortem interferometer measurements can be used to demonstrate the thermal stability of the micro-cantilevers.

Mechanical actuation is also important for MEMS microswitches. Fully functioning switches have micro-fabricated electrical circuitry to electrostatically induce cantilever beam actuation, but baseline mechanical testing can be accomplished with a piezo-actuated probe tip that mechanically deflects the beams. Interferometry fringes can be used to measure the evolution of the residual stress and stress gradient after fixed numbers actuations and this would provide a measure of low-cycle fatigue. Similarly, extended time mechanical actuation provides a measure of time-dependent creep. Building in electrostatic actuation allows for automation of these tests.

It is also important to consider the electrical aspect of a MEMS device. Humidity and organic matter can impact the reliability and function of a MEMS device because contaminants act as insulators, creating electrical shorts, and diminish the quality and/or function of the device. Furthermore, moisture on the device serves as a conductor, creating electrical leakage of current that further degrades its quality and/or function. Hermetically sealing the MEMS device eliminates many of these environmental concerns.

The impact of heat treatment on the mechanical behavior was studied by annealing as-deposited films at 600, 800, 1000° C. for 1 hour in a custom-built vacuum furnace. The films were sandwiched between two alumina plates and the furnace was pumped down below $10^{-6}$ Torr to limit oxidation and avoid curling of the film during annealing. Microstructural changes resulting from the annealing process were observed via transmission electron microscopy (TEM). TEM samples were prepared using a Struers twin jet electropolisher and an electrolyte of 15 vol. % perchloric acid and 85 vol. % ethanol. TEM images were acquired using a Philip CM 300 microscope at 300 kV. The phase content and crystallographic texture of the films was assessed using X-ray diffraction (XRD), and further confirmed using TEM-based automated crystal orientation mapping (ACOM). The surface and cross-sectional microstructure of the samples was characterized using both a Tescan Mira field emission scanning electron microscope (SEM) and a FEI Strata DB235 Dual-Beam focused ion beam and scanning electron microscope (FIB/SEM).

Figure 8:
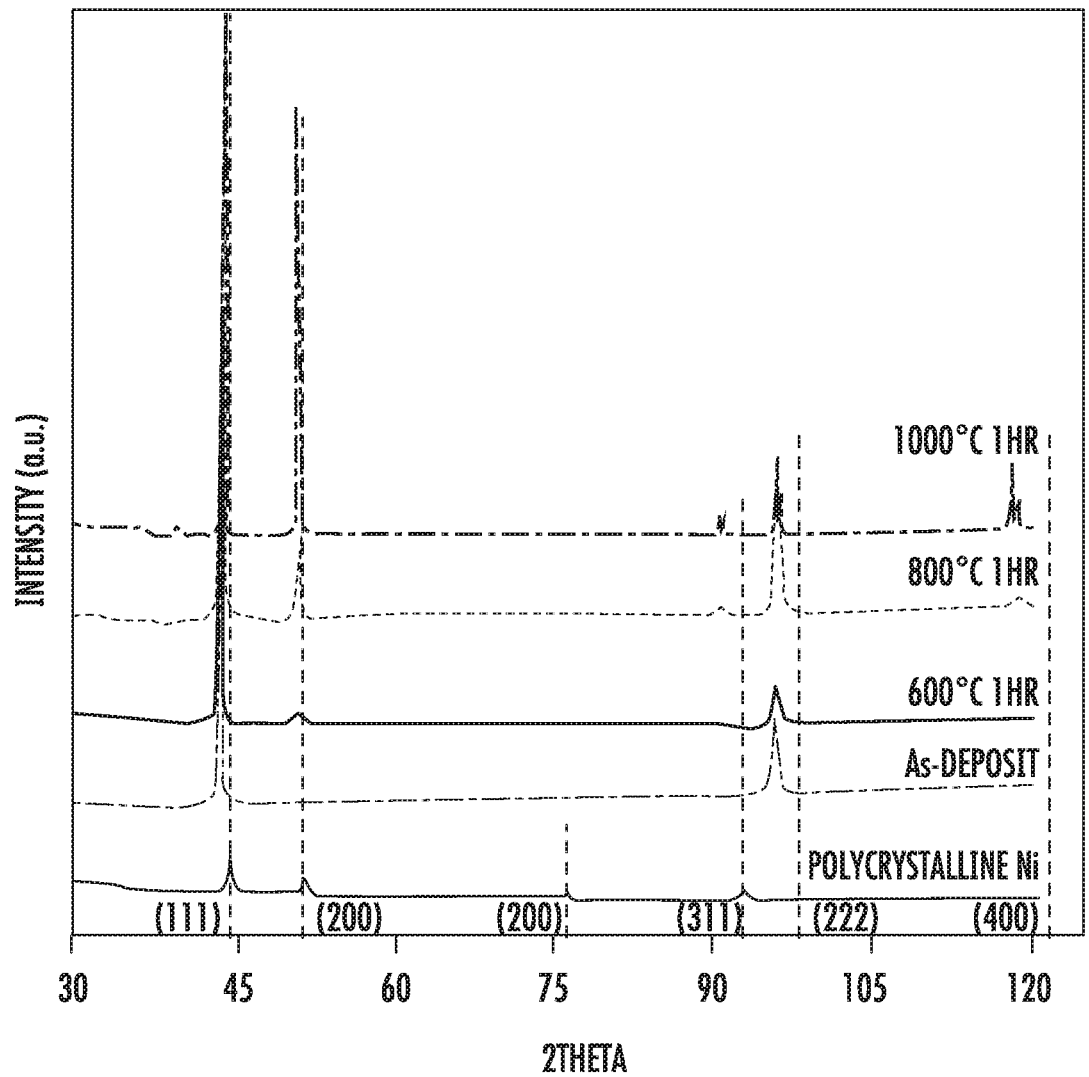
FIG. 8 illustrates a graphical view of XRD data showing a strong (111) out-of-plane texture for the as-deposited $Ni_{83.6}Mo_{14}W_{2.4}$ films and evidence of recrystallization in the films annealed above 800° C.

X-ray diffraction (XRD) data from the sputter deposited $Ni_{83.6}Mo_{14}W_{2.4}$ films annealed at different temperatures are compared with polycrystalline Ni (sputter deposited at 200 W and 2 mTorr argon pressure) in FIG. 18. FIG. 8 illustrates a graphical view of XRD data showing a strong (111) out-of-plane texture for the as-deposited $Ni_{83.6}Mo_{14}W_{2.4}$ films and evidence of recrystallization in the films annealed above 600° C. XRD data for polycrystalline Ni is included for reference. The as-deposited alloy film is found to be a supersaturated single-phase nickel solid solution alloy with preferred (111) out-of-plane texture. This is consistent with the quench rates of the high-energy sputtering process. While the diffraction profile from the film annealed at 600° C. is nearly identical to that of the as-deposited film, diffraction profiles from films annealed at 800° C. or 1000° C. clearly include both (200) and (311) reflections. This is indicative of recrystallization. The XRD reflections for the solid solution alloy are slightly shifted as compared to the sputter deposited polycrystalline Ni peaks, and this is attributed to extended lattice spacing due to addition of Mo and W atoms. The measured lattice parameter for the $Ni_{83.6}Mo_{14}W_{2.4}$ films is 0.36 nm, 10% larger than 0.32 nm for the polycrystalline Ni film.

Figure 9A:
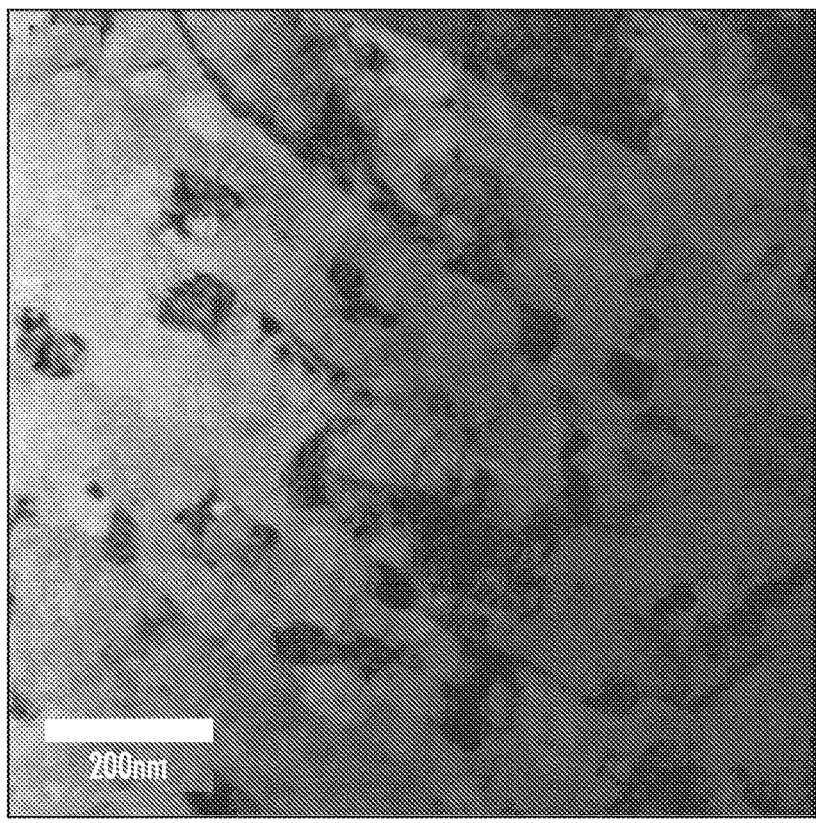
FIG. 9A illustrates the film as-deposited.
Figure 9B:
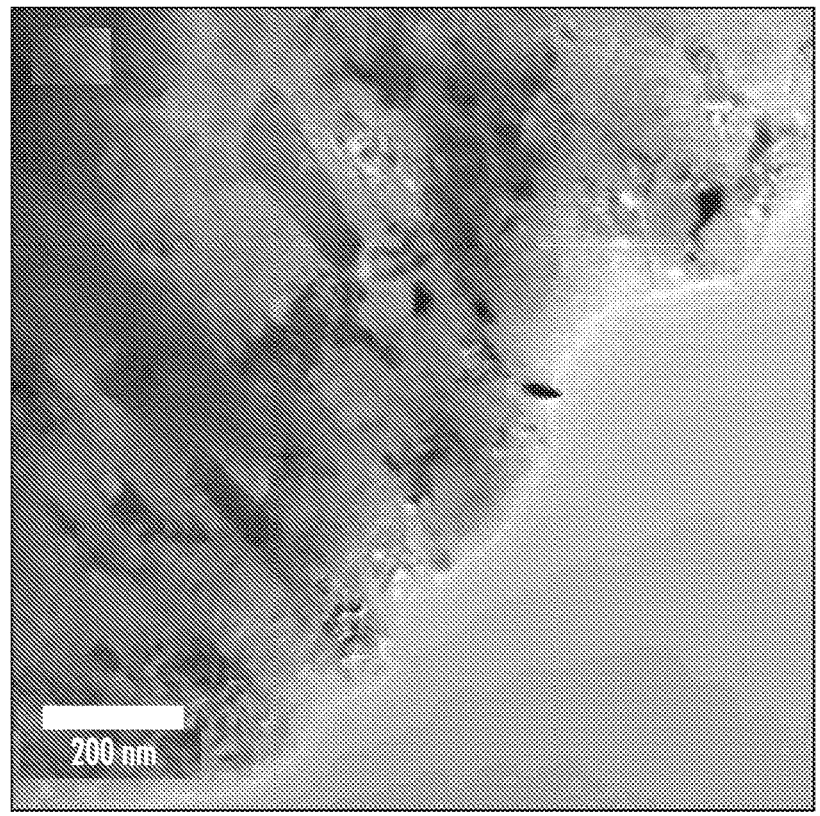
FIG. 9B illustrates the film heat-treated at 600° C.
Figure 9C:
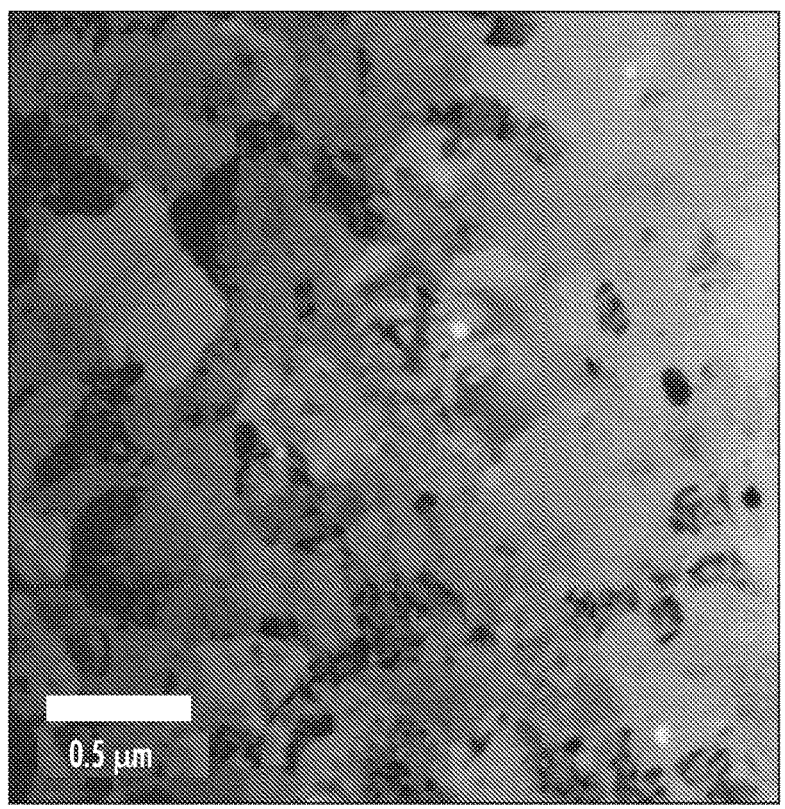
FIG. 9C illustrates the film heat treated at 800° C.
Figure 9D:
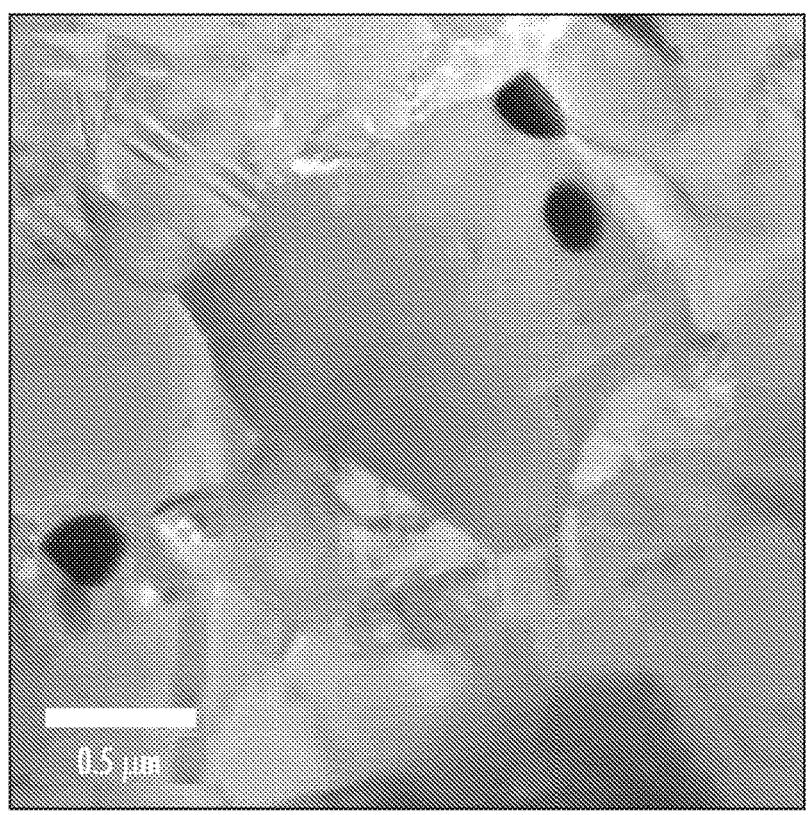
FIG. 9D illustrates the film heat treated at 1000° C.
Figure 10A:
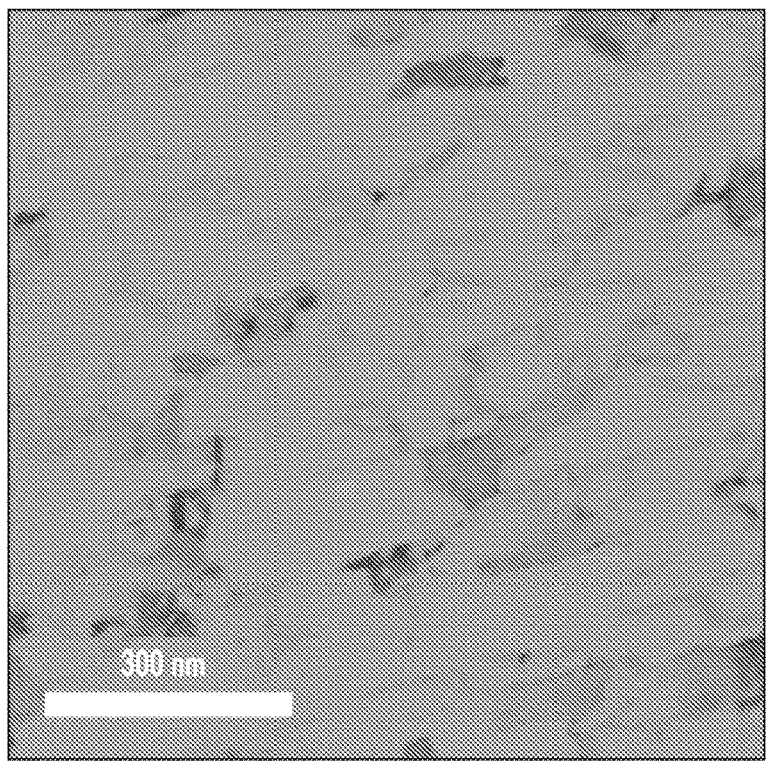
FIGS. 10A-10D illustrate TEM orientation mapping of the heat-treated films based on collection of precession electron diffraction patterns.
Figure 10B:
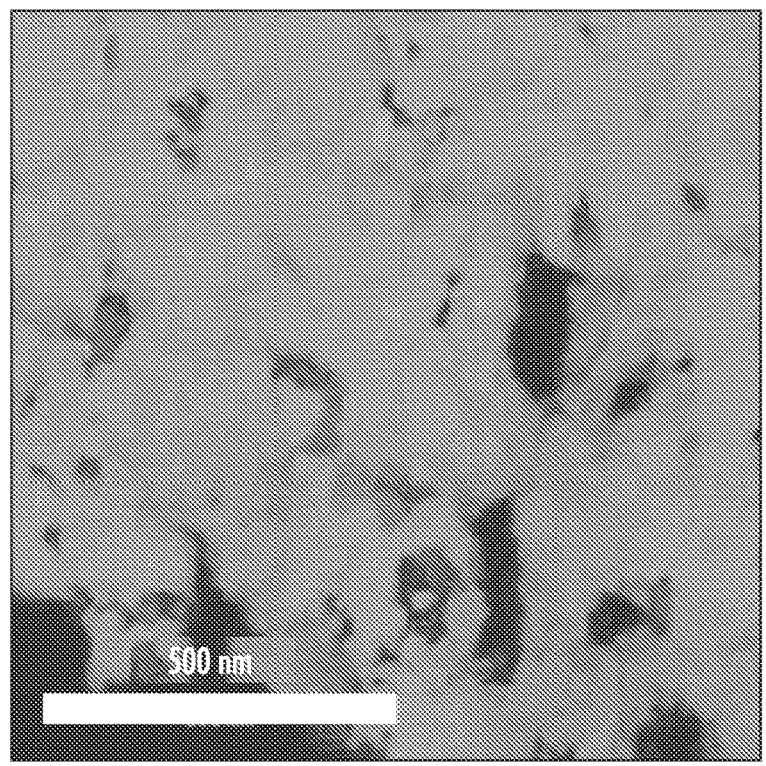
Figure 10C:
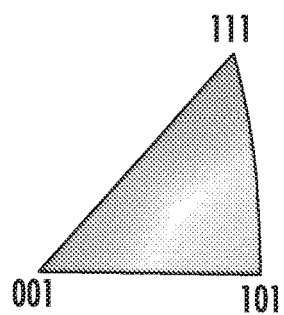
Figure 10C:
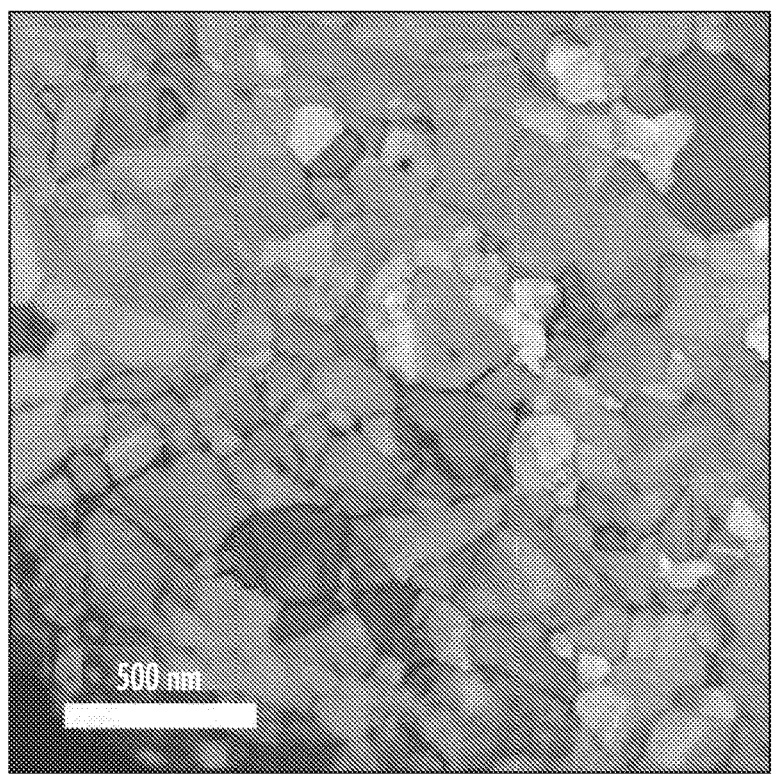
Figure 10D:
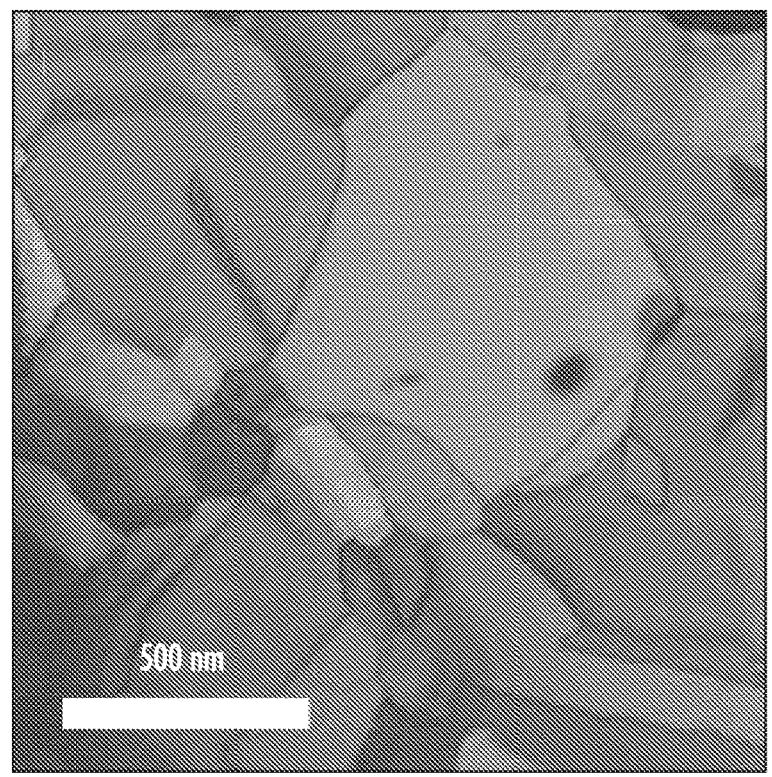

Plane-view bright-field TEM images of the deposited films heat-treated at different temperatures are shown in FIGS. 9A-9D. FIGS. 9A-9D illustrate images of plane view bright field TEM images of the $Ni_{83.6}Mo_{14}W_{2.4}$ films. FIG. 9A illustrates the film as-deposited, FIG. 9B illustrates the film heat-treated at 600° C., FIG. 9C illustrates the film heat treated at 800° C., and FIG. 9D illustrates the film heat treated at 1000° C. As-deposited films had an in-plane grain size of approximately 100 nm. Extensive grain growth was previously reported for Ni thin films that were annealed in a relatively low temperature regime (below 500° C.), but TEM observations of the Ni—Mo—W alloy film annealed at 600° C. for 1 hour provided no evidence of grain growth. For films annealed at 800° C. for 1 hour, minute grain growth was observed in addition to formation of small precipitates (less than 100 nm) throughout the film. Annealing at 1000° C. for 1 hour resulted in significant grain growth (several microns) and larger precipitates (several hundred nanometers). TEM-based orientation maps of the as-deposited and heat-treated films are shown in FIGS. 10A-10D. Supporting the XRD results, these orientation map also reveals a strong (111) out-of-plane texture for the as-deposited film, which breaks down with subsequent heat-treatment at elevated temperatures. FIGS. 10A-10D illustrate TEM orientation mapping of the heat-treated films based on collection of precession electron diffraction patterns. FIG. 10A illustrates the film as-deposited, FIG. 10B illustrates the film heat-treated at 600° C., FIG. 10C illustrates the film heat treated at 800° C., and FIG. 10D illustrates the film heat treated at 1000° C. FIG. 10C also illustrates the process by which the textured microstructure is gradually replaced by randomly oriented, equiaxed nanoscale grains-presumably the result of recrystallization.

Figure 11:
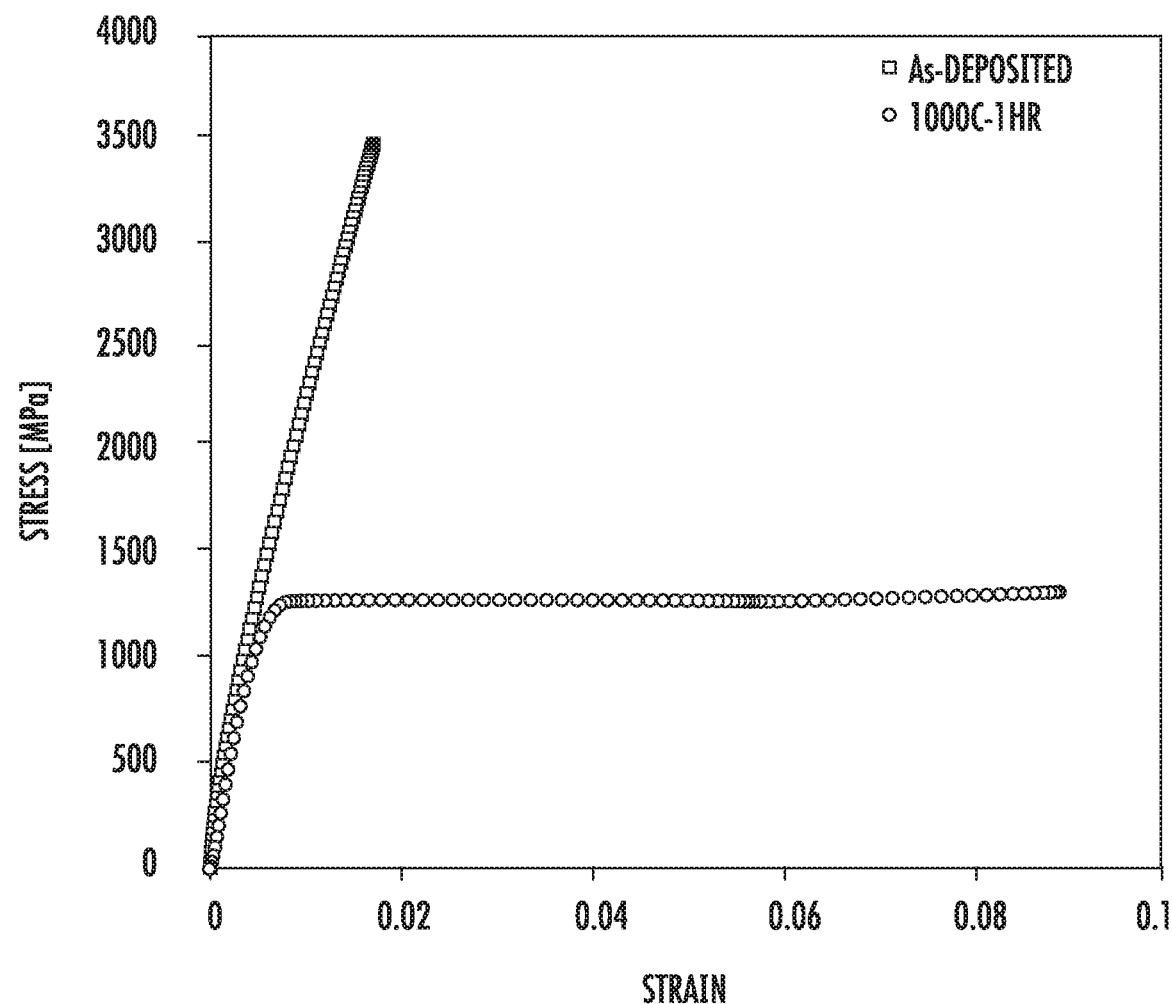
FIG. 11 illustrates a graphical view of stress-strain curves of $Ni_{83.6}Mo_{14}W_{2.4}$ films annealed at different temperatures. The as-deposited films exhibit nearly linearly elastic behavior to an ultra-high strength and modest plasticity that increases fracture toughness. Annealing at 1000° C. results in high strength and ductility.

Representative stress-strain curves of films heat treated at different temperatures are shown in FIG. 11. FIG. 11 illustrates a graphical view of stress-strain curves of the as-deposited films and films annealed at 1000° C. Exceptionally high strength near 3.4 GPa was measured for the as-deposited film, without sign of plastic deformation. Surprisingly, films annealed at 1000° C. for 1 hour exhibit perfect elastic-plastic deformation behavior with strength greater than 1.2 GPa and 9% tensile ductility.

Figure 12A:
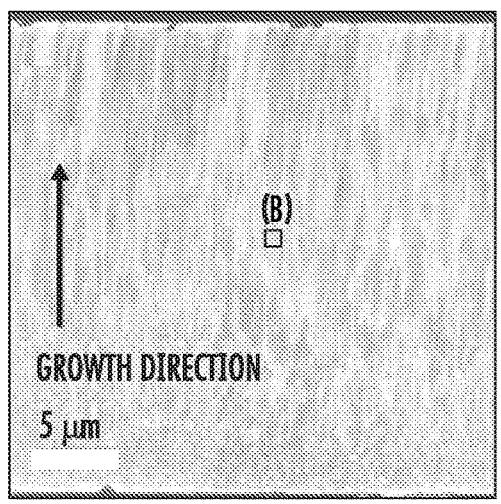
FIGS. 12A-12F illustrate cross-sectional FIB images of $Ni_{83.6}Mo_{14}W_{2.4}$ films annealed at different temperatures: (a) no anneal, (b) 600° C., (c) 800° C. and (d) 1000° C.
Figure 12B:
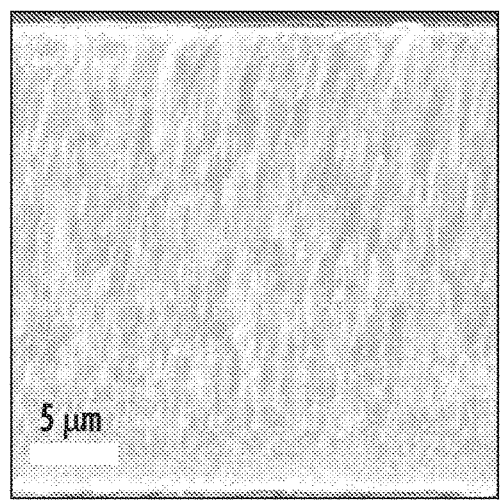
Figure 12C:
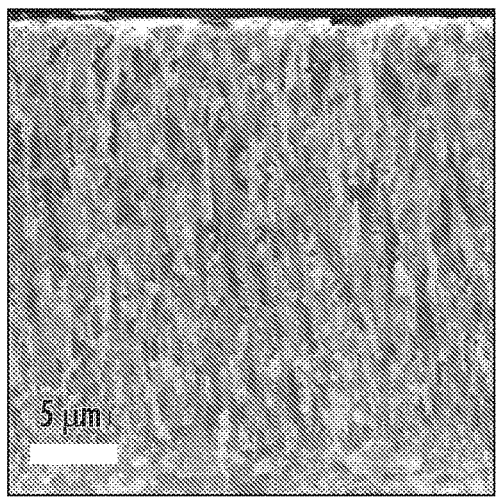
Figure 12D:
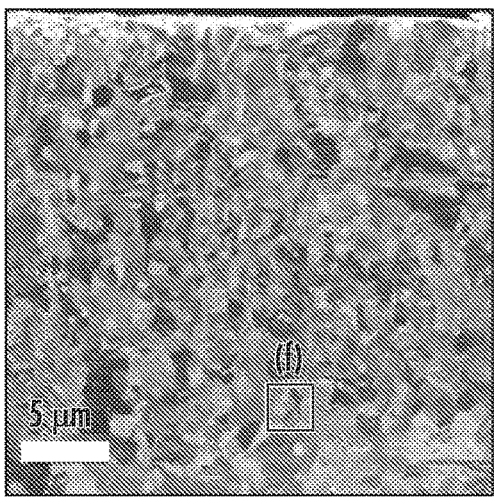
Figure 12E:
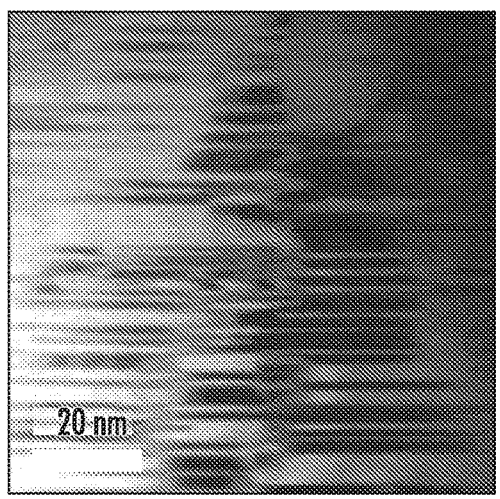
Figure 12F:
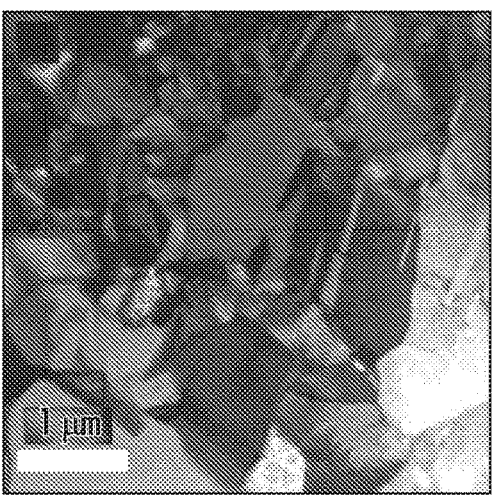

Cross-sectional microstructure of the as-deposited film and films heat-treated at elevated temperatures are shown in FIGS. 12A-12F. FIGS. 12A-12D illustrate cross-sectional FIB images. FIG. 12A illustrates the film as-deposited, FIG. 12B illustrates the film heat-treated at 600° C., FIG. 12C illustrates the film heat treated at 800° C., and FIG. 12D illustrates the film heat treated at 1000° C. FIB channeling contrast reveals the as-deposited film as a columnar structure. Columnar microstructure is often detrimental to the mechanical behavior of films due to the formation of intergrain voids. However, densely packed columnar microstructures have also been reported with high in-plane strength. Cross-sectional FIB and TEM images indicate that the as-deposited $Ni_{83.6}Mo_{14}W_{24}$ films consist of densely packed columnar grains. In addition to the columnar structure, an extremely high density of planar defects (stacking faults and nanotwins) was observed within the grains. These planar defects are parallel to the film surface and separated by only a few nanometers, as observed in cross-sectional TEM micrographs, see for example FIG. 12E. FIG. 12E illustrates a bright-field cross-sectional TEM micrograph of the as-deposited film, which reveals the presence of a high-density of nanotwins within the columnar grains. FIG. 12F illustrates equiaxed micron-scale grains shown in bright-field cross-sectional TEM micrograph of the film annealed at 1000° C. indicates that large grain growth occurred above 800° C.

Figure 13:
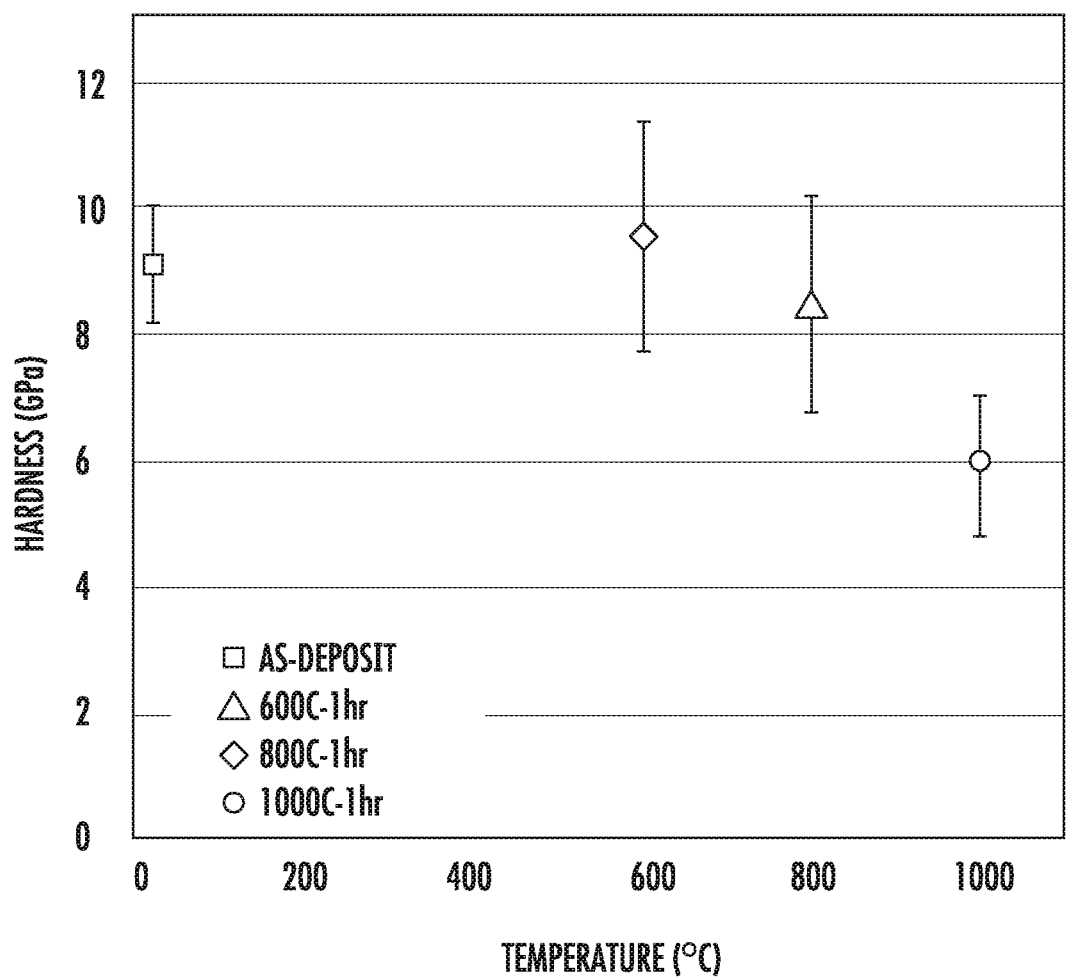
FIG. 13 illustrates a graphical view of hardness measured by nanoindentation.

FIB cross-sectional images, see FIG. 12B, and high resolution TEM imaging confirms that the columnar structure, stacking faults and nanotwins remain in the Ni—Mo—W films even after being heat-treated at 600° C. For films annealed at 800° C., only small differences were observed; the majority of the film remained columnar but a minority of nano-scale equiaxed grains were observed and associated with recrystallization. By contrast, after annealing at 1000° C. for 1 hour, only a limited number of columnar grains remained and most of the film contained larger equiaxed grains. Table IV, below, shows in-plane average grain size, elastic modulus, tensile strength, hardness, and CTE of the sputter deposited $Ni_{836}Mo_{14}W_{24}$ films as deposited and annealed at 1000° C. FIG. 13 illustrates a graphical view of hardness measured by nanoindentation. This information is also shown in Table IV. As shown in FIG. 13 and Table IV, annealing the films at higher temperatures leads to enhanced surface diffusion and grain growth.

TABLE IV

| Heat treatment | In-plane Grain size (nm) | Elastic modulus (GPa) | Tensile strength (MPa) | Hardness (GPa) | CTE at RT (° C.$^{-1}$) |
| --- | --- | --- | --- | --- | --- |
| As-deposited | 91 ± 40 | 221 ± 22.7 | 3,400 ± 373 | 9.1 ± 0.9 | 10.7 × 10$^{-6}$ |
| 1000° C | 729 ± 469 | 238 ± 33.1 | 1,263 ± 126 | 5.9 ± 1.1 | 10.5 × 10$^{-6}$ |

The yield strength and hardness of the films heat-treated for 1 hour at 1000° C. are still over 1 GPa and 6 GPa, respectively. Solid solution strengthening, $\Delta\sigma_{Fleischer}$, can be estimated using equation (4) with a Taylor factor M=3.06 for randomly oriented grains [62]. The contribution coming from solid solution strengthening is $\Delta\sigma_{Fleischer}$=447 MPa if we account for the formation of precipitates and assume the matrix composition to be $Ni_{87.1}Mo_{10.5}W_{2.4}$.

Grain boundary strengthening due to dislocation pile-up can be estimated by using the Hall-Petch relationship:

$$\sigma_{y,HP}(d) = \sigma_0 + \frac{k_{HP}}{\sqrt{d}} \quad (9)$$

where d is the grain size, $\sigma_0$ is the intrinsic stress for large single crystals, and $k_{HP}$ is a material constant. Since $k_{HP}$ for nickel is available from hardness measurements, that relationship was used and converted to the yield strength using $H_{HP}=3\sigma_{y,HP}$. Estimates of grain boundary strengthening based on these literature values $$\left(H_0 = 800 \text{ MPa and } k = 18.7 \text{ GPa/nm}^{\frac{1}{2}}\right)$$

give $\sigma_{y,HP}$=448 MPa. Assuming that solid solution strengthening and grain boundary strengthening are additive, the estimated yield strength of the material is 945 MPa, slightly lower than the experimental measurements (Table IV). This difference originates from i) assuming a randomly oriented polycrystalline, ii) columnar grains with nano-twins remaining in the matrix, and iii) precipitation hardening by dispersed particles within the grains. Samples annealed at 1000° C. show typical ductile failure morphology—dimples and necking of the film, as illustrated in FIG. 17B. Strain localization leading to decohesion of precipitates from the matrix and/or cracking of individual precipitates were also observed.

Figure 14:
FIG. 14 illustrates image and schematic views showing microstructural evolution of the samples during heat treatment.
Figure 14:
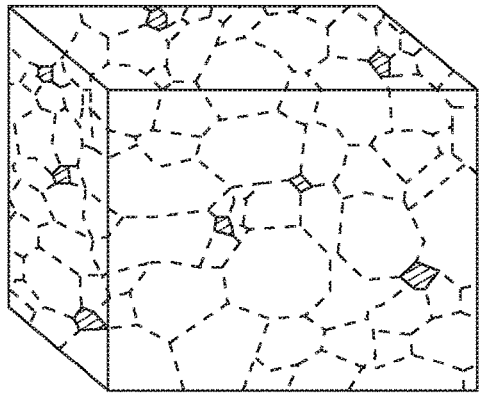
Figure 14:
Figure 14:
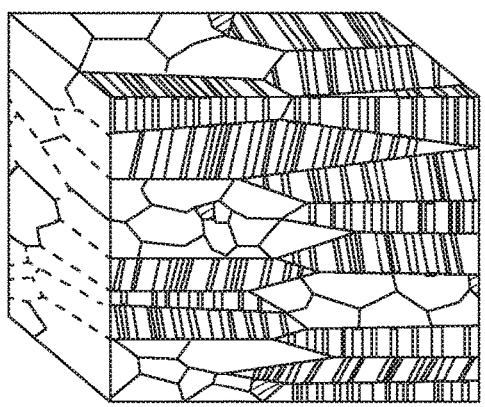
Figure 14:
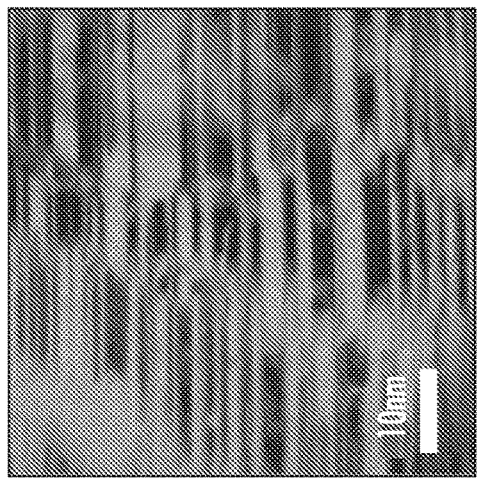
Figure 14:
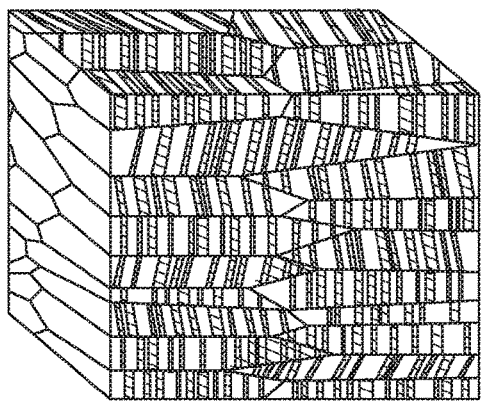

FIG. 14 summarizes microstructural evolution during heat treatment of the sputter deposited films. FIG. 14 illustrates image and schematic views showing microstructural evolution of the samples during heat treatment. The as-deposited film goes down as a supersaturated single-phase solid solution consisting of columnar grains with a strong (111) out-of-plane texture. As-deposited films show exceptionally high tensile strengths, for example, up to 3.4 GPa and hardness above 9 GPa. The supersaturated single-phase structure filled with nanotwins lead to exceptional thermal stability, and therefore, significant grain growth is not observed even in the films annealed at 600° C. for 1 hour. Only after annealing films at temperatures above 800° C., detwinning, recrystallization, grain growth, and precipitation were noticed. Annealing at 800° C. resulted in limited grain growth and films still show high strength, but brittle behavior. After annealing at 1000° C. for 1 hour, the microstructure consists of large equiaxed grains with large precipitates. The strength is lower than for the as-deposited films but still formidable, and the ductility of this films is significant and can be explained by extensive grain growth. Note that the schematic images in FIG. 14 have been reconstructed based on isothermal observations and should not be taken to mean that the microstructural evolution only occurs at a specific temperature.

Figure 15:
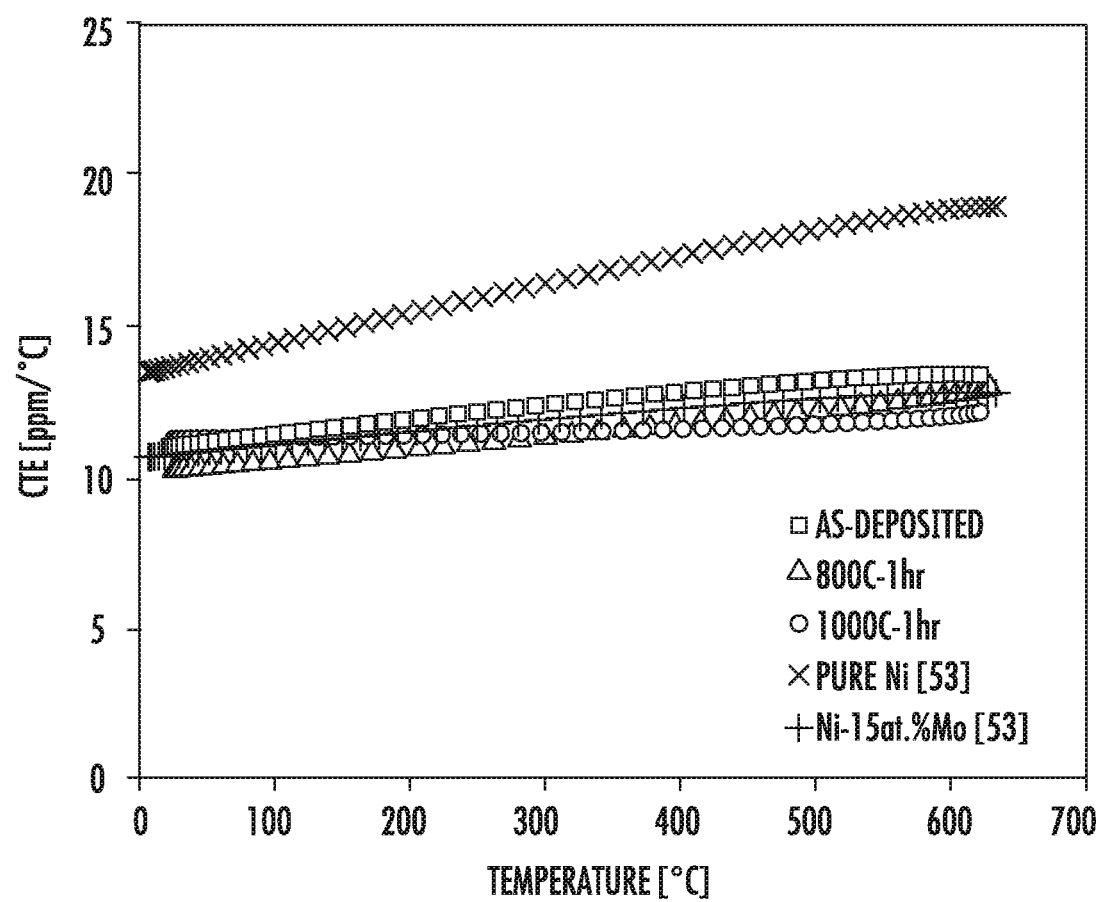
FIG. 15 illustrates a CTE-temperature curve for $Ni_{83.6}Mo_{14}W_{2.4}$ films annealed at different temperatures and compared with a reference value for pure Ni.

It is expected that adding Mo to Ni would offer high creep resistance, high thermal conductivity, high corrosion resistance, and low CTE, making the alloy very attractive for high temperature device applications. From dilatometry experiments, Ni—Mo alloy with 15% Mo results in ~20% decrease of the room temperature CTE. In order to evaluate whether the sputter deposited Ni—Mo—W alloy offers a similar advantage, non-contact CTE measurements were performed with a custom-built setup using DIC for strain measurements. CTE-temperature curve for films annealed at different temperatures are shown and compared with pure nickel in FIG. 15. FIG. 15 illustrates a CTE-temperature curve for films annealed at different temperatures. Data for the film annealed at 600° C. was neglected due to curling of the film during heating. As expected, CTE for the Ni—Mo—W alloy is considerably lower (22% decrease) than the CTE value of pure nickel and less sensitive to temperature. The combination of excellent mechanical properties and remarkably improved dimensional stability makes sputtered Ni—Mo—W a promising structural material for MEMS.

Sputter deposition of Ni alloyed with Mo and W resulted in a single-phase solid solution alloy, characterized by columnar grains and high density nanotwins. Solid solution strengthening combined with the presence of nanotwins lead to ultra-high tensile strength approaching or above 4 GPa for the as-deposited films. In some exemplary embodiments of the present invention a range of 2.5 GPa to 3.5 GPa is used. However, this range is not meant to be considered limiting, and as stated above the tensile strength can range above 2.5 GPa. The nanotwinned structure demonstrated exceptional thermal stability, with no noticeable grain growth or twin spacing evolution after annealing at 600° C. and only modest grain growth at 800° C. Films annealed at 1,000° C. exhibit perfect elastic-plastic deformation behavior with strength greater than 1.2 GPa and near 10% tensile ductility. Combination of high strength with ductility is explained using solid solution strengthening and grain boundary strengthening. CTE for the Ni—Mo—W alloy was measured to be considerably lower than pure Ni, which makes it attractive for use in sensor applications. The linear elastic (ultra-high strength) to ductile (high strength with 9% tensile elongation) transition observed in this study further suggests that sputtering and subsequent heat treatment may offer an attractive route for depositing advanced metallic MEMS materials with tailorable mechanical properties. The sputtered Ni—Mo—W can also be used as a protective coating for a number of applications.

In an exemplary implementation of the present invention, a single alloy target of $Ni_{84}Mo_{11}W_5$ was fabricated and utilized to create freestanding micro-cantilever beams. Ni—Mo—W thin films were sputter deposited at varying powers and pressures to confirm the nanotwinned structure. It should be noted that the exemplary implementations herein are included to provide further illustration of the invention and are not meant to be considered limiting. Berkovich tip nanoindentation was used to measure the hardness in the films out-of-plane and compare to the strength from the films deposited at 2500 W. There was nominally no change in the hardness of the films deposited at a range of powers and pressures, summarized in Table V below. Thus, Ni—Mo—W remained nanotwinned to yield the outstanding mechanical strength at these lower, more conventional powers. Table V provides the hardness measurements for the varying thicknesses, powers, and pressures.

TABLE V

|  | 200 W at 3 mTorr | 400 W at 1 mTorr | 600 W at 1 mTorr | 2500 W at 1 mTorr |
| --- | --- | --- | --- | --- |
| Thickness [um] | 3.0 | 2.5 | 2.3 | 21 |
| Average Hardness [GPa] | 9.75 ± 0.14 | 9.36 ± 0.24 | 9.76 ± 0.23 | 10.20 ± 0.72 |

In addition to hardness measurements, wafer curvature was explored to measure the stress in the Ni—Mo—W film at various powers. In this exemplary implementation of the present invention, the films were deposited onto 300 μm silicon wafers with a layer of 300 nm of silicon nitride on both sides. Wafer curvature measurements were taken before and after deposition, with the results summarized in Table VI below. Note, all power and pressure combinations explored are compressive, however, tensile stresses and near zero stresses can easily be achieved by altering the pressure and power combination.

TABLE VI

| Power [W] | Ar Pressure [mTorr] | Average Stress [MPa] |
| --- | --- | --- |
| 200 | 3 | −2.9 |
| 300 | 3 | −40.9 |
| 400 | 1 | −466.1 |
| 400 | 2 | −464.1 |
| 400 | 3 | −265.5 |
| 600 | 1 | −490.5 |

Figure 16:
FIG. 16 illustrates an image view of nanotwinned NiMoW with cantilever structures.

In another exemplary implementation of the present invention, preliminary freestanding micro-cantilever beams were fabricated from Ni—Mo—W films sputter deposited at power 200 W and 3 mTorr pressure since it is the least stressed film. Using multiple lithography steps, including both wet and dry etchants, blanket thin films were shaped and released into freestanding beams, which at these beam aspect ratios, were observed to be nominally flat. This indicates that the micro-cantilevers have minimal residual stress and stress gradients, and thus, are predicted to have good dimensional stability. FIG. 16 illustrates an image view of the micro-cantilevers, according to an embodiment of the present invention.

Although the present invention has been described in connection with preferred embodiments thereof, it will be appreciated by those skilled in the art that additions, deletions, modifications, and substitutions not specifically described may be made without departing from the spirit and scope of the invention as defined in the appended claims.

The invention claimed is:

1. A film comprising:
an alloy of nickel (Ni), molybdenum (Mo), tungsten (W) (Ni—Mo—W) having very high predetermined tensile strength, thermal and mechanical stability of predetermined levels, predetermined high density, predetermined low CTE, predetermined electrical properties that are similar to the bulk alloy, and a structure of nano-scale stacking faults and twins lying in a plane of the film;
wherein the alloy is deposited as a coating or freestanding thin film or device; and,
wherein the alloy comprises a crystallographic structure possessing a predetermined strong <111> crystallographic texture and a predetermined high density of nano-scale planar defects (stacking faults and twins) oriented in the plane of the film.

2. The film of claim 1 wherein the deposition of the alloy is achieved with direct current sputter deposition.

3. The film of claim 1 further comprising a tensile strength of above 2.5 GPa.

4. The film of claim 1 that is microstructurally stable and does not coarsen when exposed to stresses as high as 3.4 GPa or temperatures as high at 600° C.

5. The film of claim 1 further comprising a coefficient of thermal expansion that is lower than that for pure Ni.

6. The film of claim 1 further comprising an electrical conductivity that is similar to the alloy in bulk coarse-grained form.

7. The film of claim 1 may also be deposited as a protective coating whose mechanical strength, stability and hardness provide tribological protection against friction and wear.

8. The film of claim 1 may also be heat treated to modify the mechanical properties in a way that provides a desired balance of strength and toughness, for example, thermal annealing for 1 hour at 1,000° C. results in films with 1.2 GPa tensile strength and 9% tensile ductility.

9. The film of claim 1 further comprising an electrical conductivity that is similar to the alloy in bulk coarse-grained form.

10. The film of claim 1 may also be deposited as a protective coating whose mechanical strength, stability and hardness provide tribological protection against friction and wear.

11. The film of claim 1 may also be heat treated to modify the mechanical properties in a way that provides a desired balance of strength and toughness, for example, thermal annealing for 1 hour at 1,000° C. results in films with 1.2 GPa tensile strength and 9% tensile ductility.

12. A film comprising:
an alloy of nickel (Ni), molybdenum (Mo), tungsten (W) (Ni—Mo—W) having very high predetermined tensile strength, thermal and mechanical stability of predetermined levels, predetermined high density, predetermined low CTE, predetermined electrical properties that are similar to the bulk alloy, and a structure of nano-scale stacking faults and twins lying in a plane of the film;
wherein the alloy is deposited as a coating or freestanding thin film or device; and,
wherein the alloy is microstructurally stable and does not coarsen when exposed to stresses as high as 3.4 GPa or temperatures as high at 600° C.

13. The film of claim 12 wherein the deposition of the alloy is achieved with direct current sputter deposition.

14. The film of claim 12 further comprising a crystallographic structure possessing a predetermined strong <111> crystallographic texture and a predetermined high density of nano-scale planar defects (stacking faults and twins) oriented in the plane of the film.

15. The film of claim 12 further comprising a tensile strength of above 2.5 GPa.

16. The film of claim 12 further comprising a coefficient of thermal expansion that is lower than that for pure Ni.

* * * * *